United States Patent
Kamon

(10) Patent No.: US 9,331,212 B2
(45) Date of Patent: May 3, 2016

(54) SEMICONDUCTOR DEVICE COMPRISING AN ANTIFERROELECTRIC GATE INSULATING FILM

(75) Inventor: Kazuya Kamon, Kanagawa (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 13/461,389

(22) Filed: May 1, 2012

(65) Prior Publication Data

US 2012/0286342 A1   Nov. 15, 2012

(30) Foreign Application Priority Data

May 11, 2011   (JP) .................. 2011-106256

(51) Int. Cl.
*H01L 27/108* (2006.01)
*H01L 29/94* (2006.01)
*H01L 29/93* (2006.01)
*H01L 29/78* (2006.01)

(52) U.S. Cl.
CPC ............ *H01L 29/94* (2013.01); *H01L 29/7833* (2013.01); *H01L 29/93* (2013.01)

(58) Field of Classification Search
CPC ..................... H01L 21/823462; H01L 29/94
USPC ................. 257/288, 295, 296, 300, 310, 312
See application file for complete search history.

(56) References Cited

U.S. PATENT DOCUMENTS

| | | | | |
|---|---|---|---|---|
| 5,342,648 A | * | 8/1994 | MacKenzie et al. | 427/126.3 |
| 5,403,788 A | * | 4/1995 | Nishida et al. | 501/32 |
| 5,637,542 A | * | 6/1997 | Takenaka | 501/134 |
| 5,736,759 A | * | 4/1998 | Haushalter | 257/295 |
| 5,856,395 A | * | 1/1999 | Tanisho et al. | 524/413 |
| 5,993,541 A | * | 11/1999 | Litvin et al. | 117/63 |

(Continued)

FOREIGN PATENT DOCUMENTS

| | | |
|---|---|---|
| JP | 61-229350 | 10/1986 |
| JP | 11-204744 | 7/1999 |

(Continued)

OTHER PUBLICATIONS

Wiener et al., "Antiferroelectric Transitions in NH4H2PO4 and NH4H2AsO4 Studied by Infrared Absorption", The Journal of Chemical Physics 52 (1970) pp. 2891-2900.*

(Continued)

*Primary Examiner* — Jay C Kim
(74) *Attorney, Agent, or Firm* — McDermott Will & Emery LLP

(57) ABSTRACT

A semiconductor device having a transistor gate length greatly reduced as a result of promotion of semiconductor integrated circuit miniaturization where leakage current generation in a gate insulating film can be inhibited to enhance the transistor function. The semiconductor device includes: a semiconductor substrate having a main surface; a pair of source/drain regions formed over the main surface of the semiconductor substrate; a gate insulating film formed, over a region between the pair of source/drain regions, to be in contact with the main surface; and a gate electrode formed to be in contact with the upper surface of the gate insulating film. In the semiconductor device, the gate electrode has a length of less than 45 nm in a direction from a first one of the pair of source/drain regions to a second one of the pair of source/drain regions, and the gate insulating film has an antiferroelectric film.

17 Claims, 19 Drawing Sheets

(56) References Cited

U.S. PATENT DOCUMENTS

| | | | |
|---|---|---|---|
| 6,004,474 A * | 12/1999 | Takenaka et al. | 252/62.9 R |
| 6,025,205 A * | 2/2000 | Park et al. | 438/3 |
| 6,054,331 A * | 4/2000 | Woo et al. | 438/3 |
| 6,093,338 A * | 7/2000 | Tani et al. | 252/62.9 R |
| 6,344,991 B1 * | 2/2002 | Mikami et al. | 365/145 |
| 6,498,097 B1 * | 12/2002 | Park et al. | 438/686 |
| 6,724,025 B1 * | 4/2004 | Takashima et al. | 257/288 |
| 7,083,105 B2 * | 8/2006 | Maruyama et al. | 235/492 |
| 7,419,920 B2 * | 9/2008 | Tominaga et al. | 438/778 |
| 7,579,641 B2 * | 8/2009 | Sashida | 257/295 |
| 7,713,576 B2 * | 5/2010 | Yao et al. | 427/100 |
| 7,815,820 B2 * | 10/2010 | Tan et al. | 252/518.1 |
| 7,973,747 B2 * | 7/2011 | Ono et al. | 345/79 |
| 8,120,485 B2 * | 2/2012 | Yang | 340/572.1 |
| 8,247,484 B2 * | 8/2012 | Tan et al. | 524/394 |
| 8,336,367 B2 * | 12/2012 | Lu et al. | 73/24.06 |
| 2006/0073613 A1 * | 4/2006 | Aggarwal et al. | 438/3 |
| 2008/0315277 A1 | 12/2008 | Nakashiba | |
| 2010/0006953 A1 | 1/2010 | Boescke | |

FOREIGN PATENT DOCUMENTS

| | | |
|---|---|---|
| JP | 2000-243090 | 9/2000 |
| JP | 2001-222884 | 8/2001 |
| JP | 2001-332125 | 11/2001 |
| JP | 2002-314070 A | 10/2002 |
| JP | 2005-019598 A | 1/2005 |
| JP | 2008-0288576 | 11/2006 |
| JP | 2008-205284 | 9/2008 |

OTHER PUBLICATIONS

Japanese Office action issued in Jpanease Applicatin No. 2011-106256 dated Jul. 29, 2014, w/English translation.

* cited by examiner

FIG. 6A
FIG. 6B
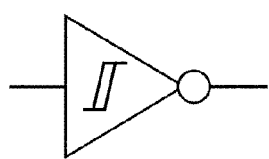
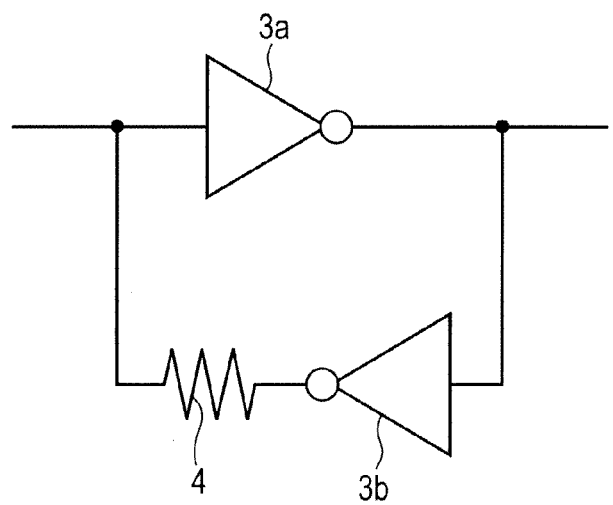

SEMICONDUCTOR DEVICE COMPRISING AN ANTIFERROELECTRIC GATE INSULATING FILM

CROSS-REFERENCE TO RELATED APPLICATIONS

The disclosure of Japanese Patent Application No. 2011-106256 filed on May 11, 2011 including the specification, drawings and abstract is incorporated herein by reference in its entirety.

BACKGROUND

The present invention relates to a semiconductor device and, more particularly, to a semiconductor device having a gate insulating film.

The gate insulating film for a transistor formed over a semiconductor integrated circuit device is formed between a gate electrode and an active area under the gate electrode. The gate insulating film is required to inhibit the generation of a gate leakage current caused by a tunneling current from the gate, while also being required to be capable of performance to generate or not to generate a channel in the active area according to a change in an electric field caused as the gate electrode is switched between an ON state and an OFF state.

The performance of a transistor depends on the electrostatic capacity of the gate insulating film used therein. Where the capacitance of the parallel plate capacitor formed between the gate electrode and the channel is represented by C, the dielectric constant of the insulating film is represented by k, the area as seen from above of the gate electrode is represented by A, and the thickness of the insulating film is represented by d, a relationship of $C=kA/d$ is established. To reduce the chip area and promote transistor miniaturization, the electrode area A as seen from above needs to be reduced. To reduce the electrode area A of a transistor without sacrificing its performance requires the insulating film thickness d of the transistor to be reduced compared with the electrode area A.

Paraelectric materials, for example, silicon oxide films have been in use as gate insulating films. As semiconductor integrated circuits are increasingly miniaturized and high integrated, however, gate insulating films have come to be as thin as a total thickness of several atoms, causing a problem of leakage current leaking through the insulating film due to a quantum tunneling effect. To be more concrete, in a case where a field effect transistor of the so-called 28-nm generation having a gate electrode length (gate length) of about 28 nm has a silicon oxide film used as a gate insulating film, the film thickness is about 2 nm. The film thickness is equivalent to a total thickness of several atoms, that is, it is extremely thin. This results in increasing the leakage current leaking through the gate insulating film due to a quantum tunneling effect. Also, when gate insulating films are made extremely thin, variations in thickness of the gate insulating films of plural transistors formed on a same substrate enlarge making transistor formation difficult.

Conversely, increasing the thickness d of gate insulating films decreases variations in thickness among plural gate insulating films. To realize a transistor having a gate insulating film with an increased thickness d and performance equivalent to that of a comparable transistor having a gate insulating film with an unincreased thickness d, it is necessary to increase the electrode area A of the transistor with the increased thickness d of the gate insulating film. To be more concrete, when, for a transistor of the 28-nm generation having a gate insulating film with a thickness d of 2 nm, the thickness d is increased to 50 nm, the voltage applied to the active area of the transistor is reduced to ½₅. With the voltage largely reduced, switching the gate electrode to an ON state cannot cause any channel to be formed in the active area, that is, the transistor is disabled. To have a channel formed by applying a voltage, as done for the transistor having a gate insulating film with a thickness d of 2 nm, to the transistor having a gate insulating film with a thickness d increased to 50 nm, it is necessary to increase the gate area A of the transistor 25 times. This means that the gate electrode whose planar shape is rectangular needs to be enlarged five times both along a planar direction (x-direction) and along another planar direction (y-direction) approximately orthogonal to the x-direction. This results in a transistor gate length of about 140 nm and makes the transistor equivalent to a five-generation older transistor.

Increasing the thickness d of the gate insulating film while maintaining the electrode area A increases the aspect ratio determined by the thickness of the whole gate including the gate insulating film and the gate electrode and the gate length. To be more concrete, in the case of a transistor of the 28-nm generation, for example, the gate insulating film thickness is about 2 nm, the gate thickness, including the thicknesses of the gate insulating film and a gate electrode, is about 50 nm, and the distance between a pair of adjacent gates is about 65 nm based on a planar view. In this case, the aspect ratio determined by the total gate thickness and the gate length is about 2. If the gate insulating film thickness is increased to 50 nm while leaving the other dimensions unchanged, the aspect ratio increases to about 4. Generally, the mechanical durability of a gate electrode is secured by forming side wall insulating films to be in contact with the side walls on both sides of the gate electrode. Increasing the aspect ratio to about 4 may, however, cause the gate electrode to be broken by the stress generated when the gate electrode is chemically mechanically polished during gate processing.

Recently, instances have been reported in which a gate insulating film made of a high dielectric constant material called "high-k" is used to address the above problem. A high dielectric constant material is paraelectrics having a large dielectric constant k, and using a gate insulating film made of a high dielectric constant material can increase the capacitance C of a parallel plate capacitor included in a transistor, making it possible to widen the distance between the gate electrode and the active area. Namely, the gate insulating film can be made thicker. A thick gate insulating film allows, when the gate electrode is in an ON state, an adequately strong electric field to be applied to the active area and, when the gate electrode is in an OFF state, a physically large distance to be secured between the gate electrode and the active area so as to reduce leakage current attributable to a tunneling effect. As a result, the transistor, in which gate leakage current is reduced compared with prior-art transistors, can be operated consuming less power than before.

However, when a gate insulating film made of a high-k material is used in combination with a gate electrode made of polycrystal silicon, trouble tends to develop at an interface (contact surface) between the gate insulating film and the gate electrode to cause rising of the operating voltage. In addition, phonon vibration may internally occur to impede the flow of electrons.

The dielectric performance of a gate insulating film can be enhanced also by using a ferroelectric material instead of a high dielectric constant material. For example, as disclosed in Japanese Unexamined Patent Publication No. 2001-332125, the variation in dielectric constant of a ferroelectric material caused by temperature changes can be reduced by using a gate insulating film including two ferroelectric materials of different compositions. Also, as disclosed in Japanese Unexamined Patent Publication No. Hei 11(1999)-204744, by including a small amount of titanium in a ferroelectric film used as a gate insulating film, the increase in leakage current in the gate insulating film can be inhibited and, hence, the variation in dielectric constant of the ferroelectric film caused by temperature changes can be reduced.

On the other hand, in Japanese Unexamined Patent Publication No. 2008-205284, an organic field effect transistor (FET) having a gate insulating film made of an antiferroelectric film is disclosed. Furthermore, capacitors using an antiferroelectric film as an insulating film are disclosed, for example, in Japanese Unexamined Patent Publication No. 2001-222884 and Japanese Unexamined Patent Publication No. 2000-243090.

SUMMARY

The ferroelectric materials disclosed in Japanese Unexamined Patent Publication Nos. 2001-332125 and Hei 11(1999)-204744 each have a high dielectric constant. By using a ferroelectric material having a high dielectric constant as a gate insulating film for a transistor, the transistor function can be enhanced, for example, such that, even if the gate insulating film is formed to be thick in a process for transistor miniaturization, a channel region is formed when the gate electrode is switched to an ON state so as to allow an electric current to flow through the channel. When such a ferroelectric gate-insulating film is used, however, spontaneous polarization remains in the gate insulating film even when the gate electrode is switched from an ON state to an OFF state with the ferroelectric gate-insulating film having a hysteresis characteristic. This allows the channel formed when the gate electrode is switched to an ON state to remain without disappearing and possibly causes an electric current to flow through the channel.

The organic FET disclosed in Japanese Unexamined Patent Publication No. 2008-205284 has a channel length of 50 μm and a gate insulating film thickness of 50 nm or more, indicating that the technique disclosed therein is not assumed to be applied to miniaturized transistors of the 28-nm generation. In Japanese Unexamined Patent Publication Nos. 2001-222884 and 2000-243090, too, no technology appropriately applicable to miniaturized transistors is disclosed.

The present invention has been made in view of the above problems, and it is an object of the present invention to provide a semiconductor device which can inhibit the generation of leakage current in a gate insulating film used in a transistor having a gate length greatly reduced as a result of semiconductor integrated circuit miniaturization and which can thereby enhance the function of the transistor.

The semiconductor device according to an aspect of the present invention is structured as follows.

The semiconductor device includes: a semiconductor substrate having a main surface; a pair of source/drain regions formed over the main surface of the semiconductor substrate; a gate insulating film formed, over a region between the pair of source/drain regions, to be in contact with the main surface; and a gate electrode formed to be in contact with an upper surface of the gate insulating film. In the semiconductor device, the gate electrode has a length of less than 45 nm in a direction from a first one of the pair of source/drain regions to a second one of the pair of source/drain regions, and the gate insulating film has an antiferroelectric film.

According to the aspects of the embodiment, in a semiconductor device having a gate electrode with a greatly reduced length of 45 nm or less, a gate insulating film having an antiferroelectric film with a high dielectric constant comparable to that of a ferroelectric material is formed. Therefore, the gate insulating film can be made thick to an extent where, when the gate electrode is in an ON state, flowing of a leakage current through the gate insulating film with a high dielectric constant can be inhibited. This makes it possible to cause a channel formed in the active area to disappear when the gate electrode is switched to an OFF state, so that the leakage current flowing between the gate insulating film and source region and the drain region can be reduced. As a result, the function of the semiconductor device as a transistor can be enhanced.

BRIEF DESCRIPTION OF THE DRAWINGS

FIG. 2A being a schematic plan view of the structure of a region where an nMIS transistor included in a logic circuit according to the first embodiment is formed, FIG. 2B being a schematic sectional view of a first example structure along line IIB, IIC-IIB, IIC of FIG. 2A, and FIG. 2C being a schematic sectional view of a second example structure along line IIB, IIC-IIB, IIC of FIG. 2A;

FIG. 3A being a schematic plan view of the structure of a region where a pMIS transistor included in a logic circuit according to the first embodiment is formed, FIG. 3B being a schematic sectional view of a first example structure along line IIIB, IIIC-IIIB, IIIC of FIG. 3A, and FIG. 3C being a schematic sectional view of a second example structure along line IIIB, IIIC-IIIB, IIIC of FIG. 3A;

FIG. 5A being a graph showing a relationship between the electric field applied to the gate insulating film of a MIS transistor according to the first embodiment and polarization of the gate insulating film, FIG. 5B being a schematic sectional view of a MIS transistor according to the first embodiment in an OFF state, and FIG. 5C being a schematic sectional view of a MIS transistor according to the first embodiment in an ON state;

FIGS. 6A and 6B show a Schmitt trigger circuit; FIG. 6A being a circuit diagram and FIG. 6B showing a circuit configuration equivalent to the Schmitt trigger circuit of FIG. 6A;

FIG. 7A being a graph showing a relationship between the electric field applied to the gate insulating film of a MIS transistor according to the first comparison example and polarization of the gate insulating film, FIG. 7B being a schematic sectional view of the MIS transistor according to the first comparison example in an OFF state, and FIG. 7C being a schematic sectional view of the MIS transistor according to the first comparison example in an ON state;

FIG. 8A being a graph showing a relationship between the electric field applied to the gate insulating film of a MIS transistor according to the second comparison example and polarization of the gate insulating film, FIG. 8B being a schematic sectional view of the MIS transistor according to the second comparison example in an OFF state, and FIG. 8C being a schematic sectional view of the MIS transistor according to the second comparison example in an ON state;

FIG. 9A being a graph showing a relationship between the electric field applied to the gate insulating film of a MIS transistor according to the third comparison example and polarization of the gate insulating film, FIG. 9B being a schematic sectional view of the MIS transistor according to the third comparison example in an OFF state, and FIG. 9C being a schematic sectional view of the MIS transistor according to the third comparison example in an ON state;

DETAILED DESCRIPTION

Embodiments of the present invention will be described below with reference to drawings.

First Embodiment

As a first embodiment, a semiconductor device in a chip state will be described.

Figure 1:
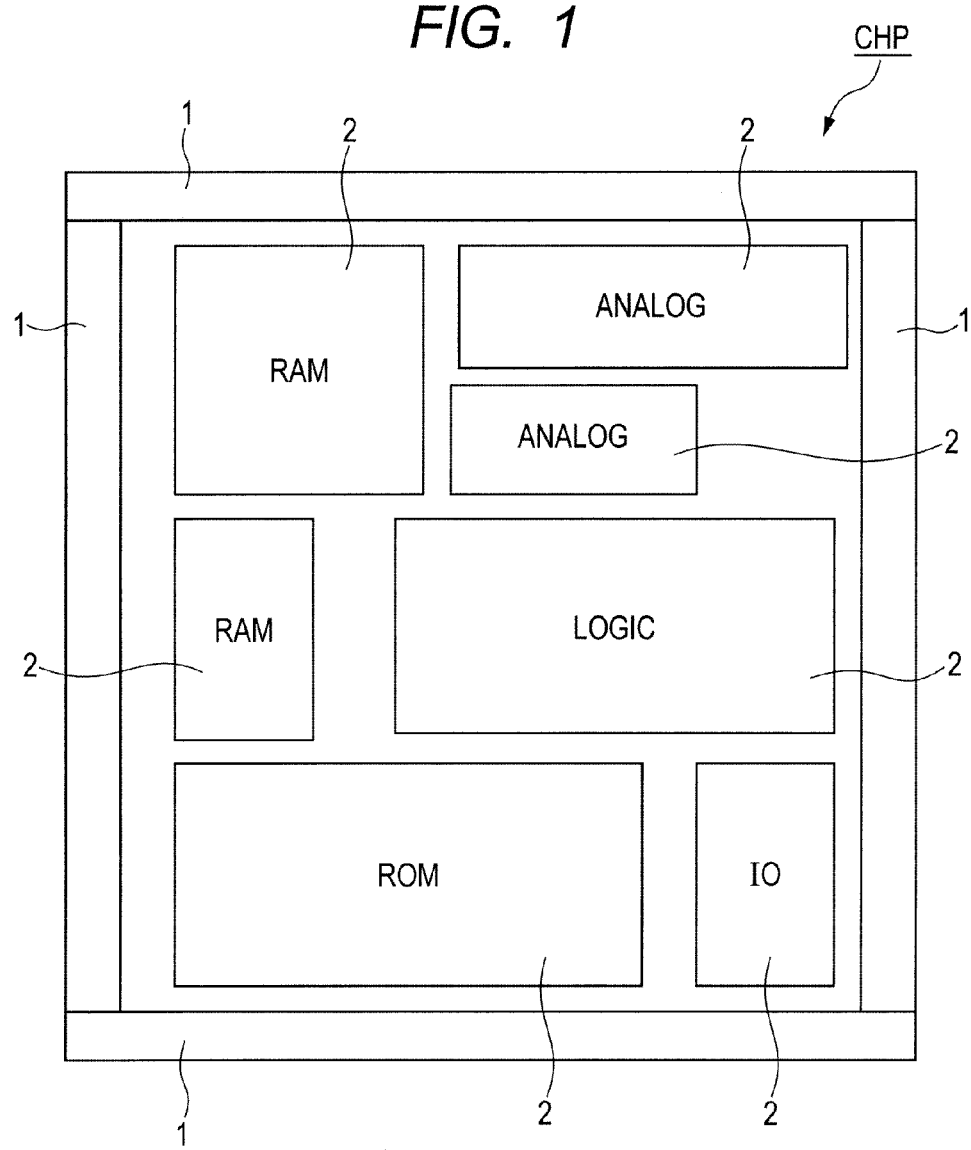
FIG. 1 is a schematic plan view showing the layout of a semiconductor chip on which a semiconductor integrated circuit according to a first embodiment of the present invention is formed.

Referring to FIG. 1, a semiconductor chip CHP on which a semiconductor integrated circuit is formed according to the first embodiment includes scribe regions 1 and module regions 2. The scribe regions 1 are formed at a peripheral end portion, as seen from above, of the semiconductor chip CHP. The module regions 2 are formed in a central part, as seen from above, surrounded by the scribe regions 1 of the semiconductor chip CHP.

The module regions 2 include an input/output circuit IO, an analog circuit, a logic circuit, a random access memory (RAM), and a read only memory (ROM). The input/output circuit IO is for inputting and outputting electric signals between a power supply circuit and the logic circuit, etc. The analog circuit performs operations using analog signals. The logic circuit includes logic control circuits and performs operations using digital signals. The RAM and ROM allow information to be written to and read from.

The semiconductor chip CHP is fabricated as follows. Based on required product specifications, a mask blank is produced through such processes as logic design, layout design and mask making. The pattern formed on the mask blank is transferred, using an ordinary photoengraving technique, to the photoresist over the main surface of a semiconductor wafer. Next, using the pattern transferred to the photoresist as a mask, ordinary etching is performed to finely form, for example, interlayer insulating layers, gate electrodes, contact holes and multilayer wirings. Besides the above method, an ordinary ion implantation technique is also used to form impurity regions. The logic circuit includes, for example, a field effect transistor called a metal insulator semiconductor (MIS) transistor.

Figure 2A:
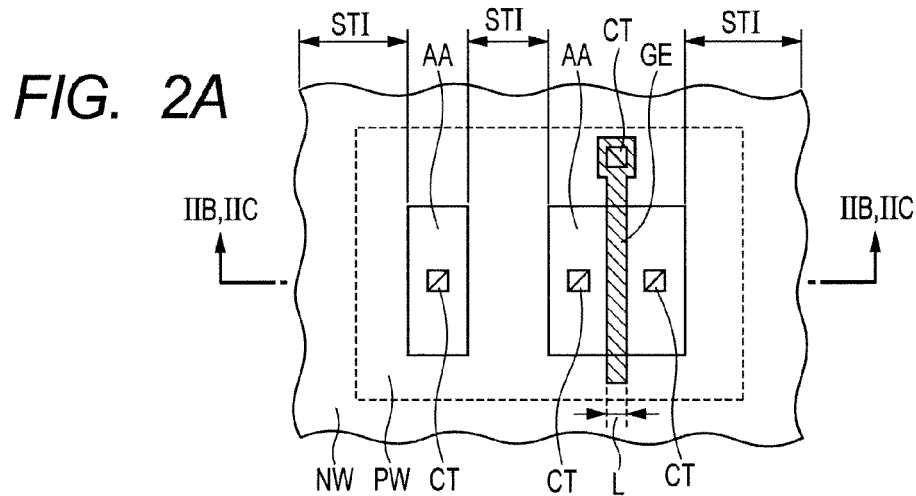
FIGS. 2A to 2C concern the first embodiment of the present invention.
Figure 2B:
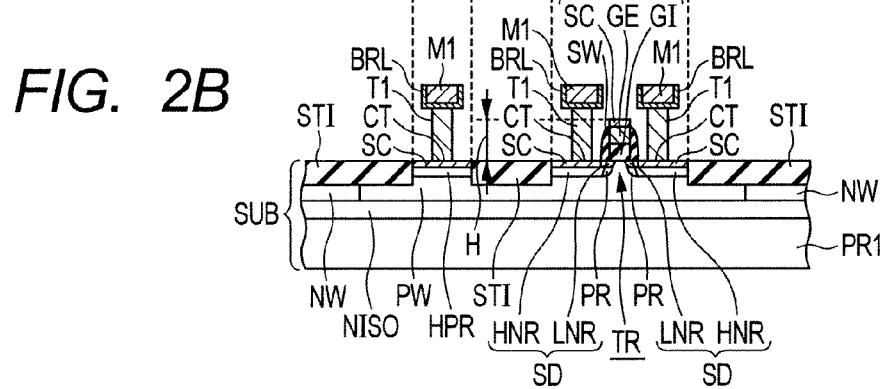

Referring to FIGS. 2A and 2B, a MIS transistor according to a first example of the present embodiment is formed, for example, on a semiconductor substrate SUB made of silicon monocrystal and is electrically isolated from other elements using an element isolation structure comprised of shallow trench isolation structures STI.

Over a p-type impurity region PR1 in the semiconductor substrate SUB, an n-type isolation layer NISO is formed. Over the n-type isolation layer NISO, an n-type well region NW and a p-type well region PW are formed. Referring to the plan view shown in FIG. 2A, the n-type well region NW is formed to surround the p-type well region PW. Also, an active area AA for transistor formation and an active area AA for contact are isolated from each other by a trench isolation structure STI.

Referring to FIG. 2B, over the surface of the p-type well region PW in the active area AA for contact (contact area), a $p^+$ region HPR is formed. The $p^+$ region HPR functions as a contact area for fixing the potential at the p-type well region PW. Over the surface of the p-type well region PW in the active area AA for transistor (MIS transistor area), an n-channel MIS transistor (hereinafter referred to as an "nMIS transistor") TR is formed. The nMIS transistor TR includes a pair of n-type source/drain regions SD, a pair of p-type regions PR, a gate insulating film GI and a gate electrode GE.

The pair of n-type source/drain regions SD are spaced apart from each other over the surface of the p-type well region PW in the active area AA for transistor (MIS transistor area). The pair of n-type source/drain regions SD each have a lightly doped drain (LDD) structure including an $n^+$ region HNR and an $n^-$ region LNR. The $n^-$ region LNR is a lightly doped n-type impurity region. A p-type region PR is formed under the $n^-$ region LNR. The p-type region PR is called a pocket. It is a p-type impurity region formed to inhibit a so-called punch-through phenomenon occurring between a source region and a drain region of a MIS transistor.

Over the region between the pair of source/drain regions SD, a gate insulating film GI of the MIS transistor is formed to be in contact with the main surface on one side of the semiconductor substrate SUB. A gate electrode GE made of, for example, polycrystal silicon is formed to be in contact with the upper surface of the gate insulating film GI. The gate electrode GE extends in the up-down direction as seen in the plan view of FIG. 2A, i.e. in the depth direction as seen in the sectional view of FIG. 2B.

Over each of the side walls of the laminated structure comprised of the gate insulating film GI and the gate electrode GE, a side wall insulating layer SW made of, for example, silicon oxide film or silicon nitride film is formed. A silicide layer SC made of, for example, $CoSi_2$ or $NiSi_2$ may be formed over the surfaces of the $p^+$ region HPR and the $n^+$ region HNR. The silicide layer SC is formed when cobalt or nickel which is a transition metal having a high melting point reacts with the silicon of the semiconductor substrate SUB.

Figure 2C:
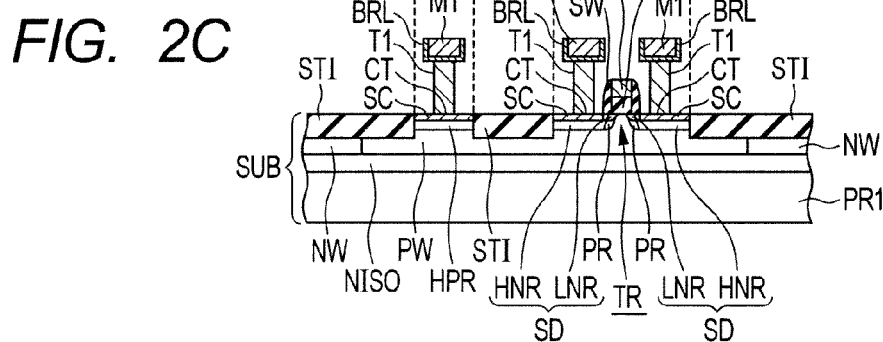

A silicide layer SC may be formed over the upper surface of the gate electrode GE as shown in FIG. 2B. That is, as shown in FIG. 2C, the gate electrode GE need not necessarily have a silicide layer SC formed thereover. FIG. 2B and FIG. 2C differ only as to whether the silicide layer SC is formed over the upper surface of the gate electrode GE. In the other respects, they are identical. Hence, in FIG. 2C, elements identical to those shown in FIG. 2B are denoted by reference symbols identical to those used in FIG. 2B, and their descriptions will not be repeated. Referring to FIG. 2B, the laminated structure comprised of the gate insulating film GI, gate electrode GE and silicide layer SC makes up a gate portion GP of the MIS transistor. Similarly, referring to FIG. 2C, the laminated structure comprised of the gate insulating film GI and gate electrode GE makes up a gate portion GP of the MIS transistor.

Referring to FIGS. 2A and 2B, again, a conductive layer T1 is formed to be in contact with the upper surface of the corresponding $p^+$ region HPR or $n^+$ region HNR and a wiring M1 is formed to be in contact with the upper surface of the corresponding conductive layer T1. Each conductive layer T1 is made of, for example, tungsten and electrically connects each wiring M1 and the corresponding silicide layer SC. The contact surface between each conductive layer T1 and each silicide layer SC makes up a contact CT.

In the plan view of FIG. 2A, the wirings M1 are omitted. Each wiring M1 includes a conductive material, for example, copper and barrier metal BRL covering the sides and bottom of the conductive material.

In the MIS transistor shown in FIGS. 2A to 2C, the length L, in the direction heading from one of the pair of source/drain regions SD to the other, of the gate electrode GE is less than 45 nm. It is preferably less than 28 nm. The length of the gate electrode GE represents the total length L of the gate portion GP. The aspect ratio (H/L), i.e. the ratio of the total thickness (height) H of the gate portion GP to the length L of the gate electrode GE (gate portion GP) is preferably 2 or larger but smaller than 4. The gap G (shown in FIG. 4) between two adjacent gate portions GP is preferably, for example, 65 nm.

The thickness t of the gate insulating film GI of the MIS transistor according to the present embodiment is preferably 2 nm or more but less than 50 nm. The gate insulating film GI has a so-called antiferroelectric film. An antiferroelectric material is a dielectric material in the crystal of which two sublattices are dielectric-polarized in opposite (antiparallel) directions to cancel the polarization of each other making the total spontaneous polarization zero and which shows a double hysteresis characteristic when subjected to changes in an electric field. To be specific, the gate insulating film is preferably made of at least one selected from a group of $Pb(In_{0.5}Nb_{0.5})O_3$, $NbNaO_3$, lead zirconate ($ZrPbO_3$), lead lanthanum zirconate titanate ($TiZrLaPbO_3$), lead zirconate titanate ($TiZrPbO_3$), $NH_4H_2PO_4$, and $NH_4H_2AsO_4$.

When, for example, the gate insulating film GI has an anti-ferroelectric film of Pb $(In_{0.5}Nb_{0.5})$ $O_3$, the anti-ferroelectric film contains indium (In) and niobium (Nb) at a proportion of about 1:1 in B site, so that array period competition between valence and lattice is eliminated. As a result, the degree of order (B-site randomness) of indium and niobium can be changed by heat treatment, and their dielectric property to show relaxer-like behavior can be changed to show ferroelectric or anti-ferroelectric behavior.

$NbNaO_3$, lead zirconate ($ZrPbO_3$), lead lanthanum zirconate titanate ($TiZrLaPbO_3$), and lead zirconate titanate ($TiZrPbO_3$) basically have a perovskite structure, so that they are resistant to heat. These materials can be formed, for example, by a gate first method or a gate last method.

When, on the other hand, forming the gate insulating film GI using $NH_4H_2PO_4$ and $NH_4H_2AsO_4$, it is preferable to use a gate last method in which, first, a temporary gate electrode GE of, for example, polycrystal silicon is formed, then a true gate electrode GE is formed after impurities are implanted in the semiconductor substrate SUB and are then thermally diffused.

Figure 3A:
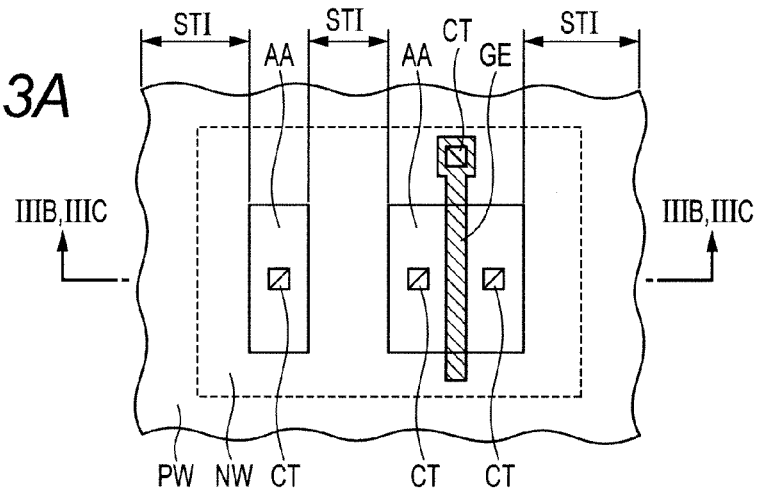
FIGS. 3A to 3C concern the first embodiment of the present invention.
Figure 3B:
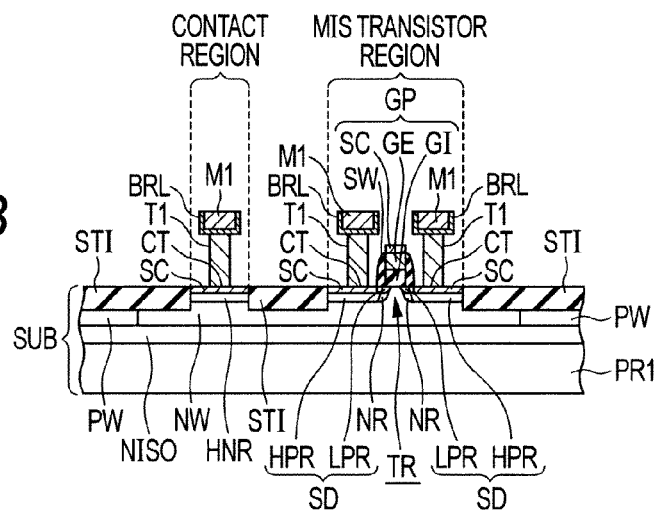

Referring to FIGS. 3A and 3B, the MIST transistor of a second example of the present embodiment differs from the MIS transistor shown in FIGS. 2A and 2B in the conductivity types of impurities contained in the well region formed over the main surface on one side of the semiconductor substrate SUB and the source/drain region. Namely, the impurity regions including a pair of $p^+$ regions HPR and a pair of $p^-$ regions LPR each function as a source/drain region SD of the p-type MIS transistor. Under each of the $p^-$ regions LPR, an n-type region NR is formed as a pocket. In the other respects than the above-described differences, FIGS. 3A and 3B are identical to FIGS. 2A and 2B. Therefore, in FIGS. 3A to 3C, elements identical to those shown in FIGS. 2A to 2C are denoted by reference symbols identical to those used in FIGS. 2A to 2C, and their descriptions will not be repeated.

Figure 4:
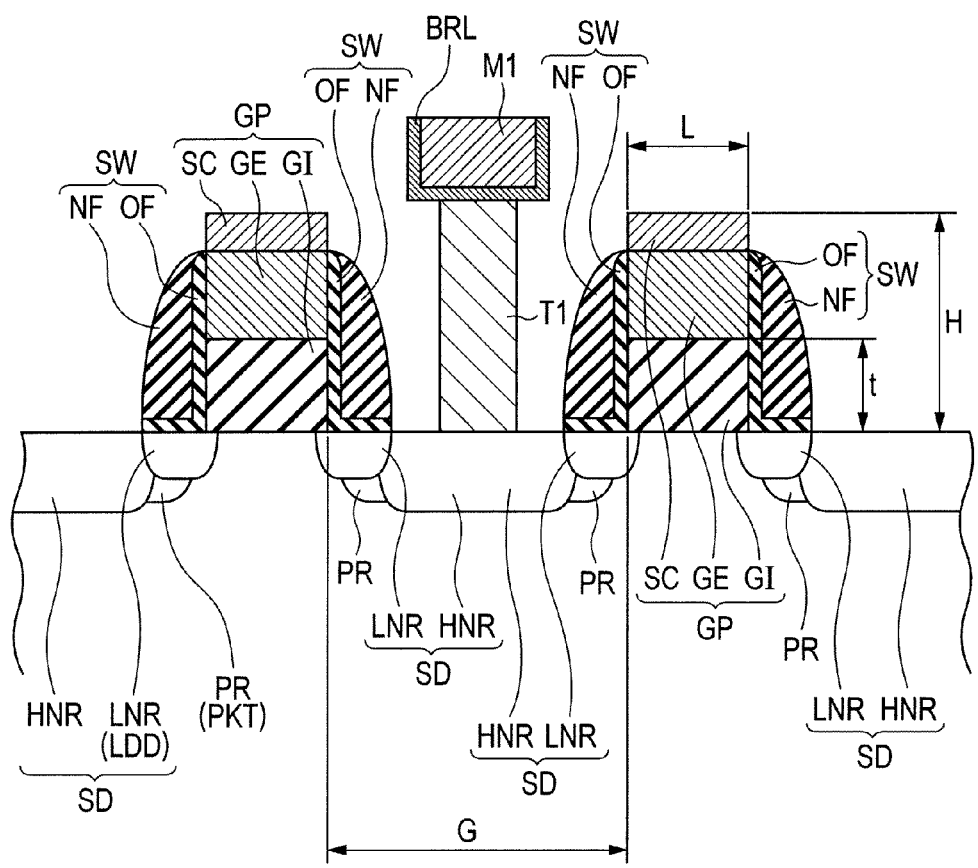
FIG. 4 is a schematic sectional view showing dimensions of a gate portion included in a MIS transistor according to the first embodiment of the present invention.

Referring to FIG. 4, the side wall insulating layers SW shown in FIG. 2B and FIG. 4 each preferably have a laminated structure having, for example, a silicon oxide film OF and a silicon nitride film NF laminated in this order.

Next, with reference to FIGS. 5A to 9B, operations and advantageous effects of the present embodiment will be described.

Figure 5A:
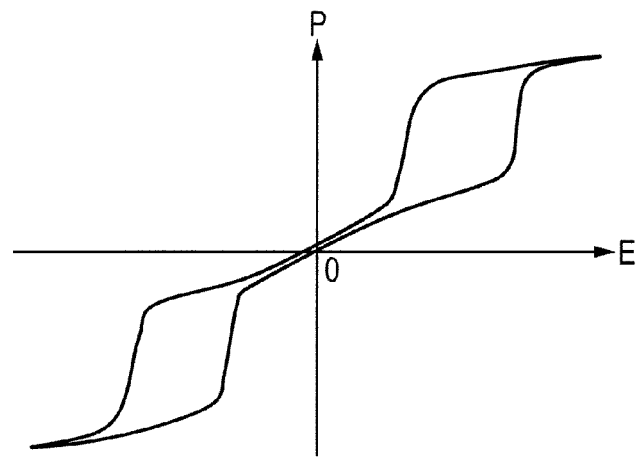
FIGS. 5A to 5C concern the first embodiment of the present invention.
Figure 5B:
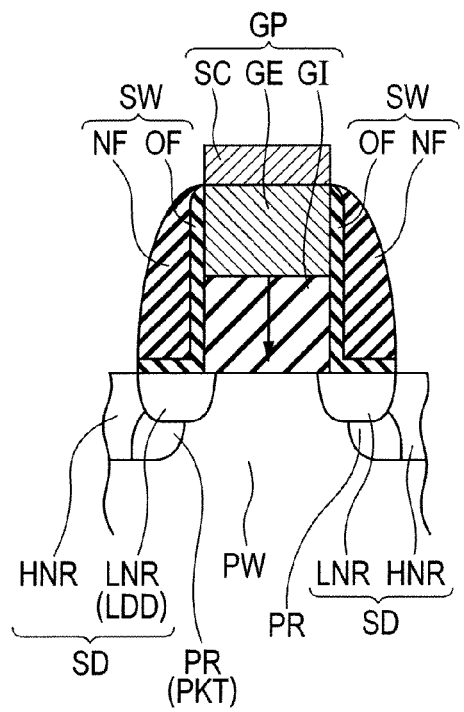
Figure 5C:
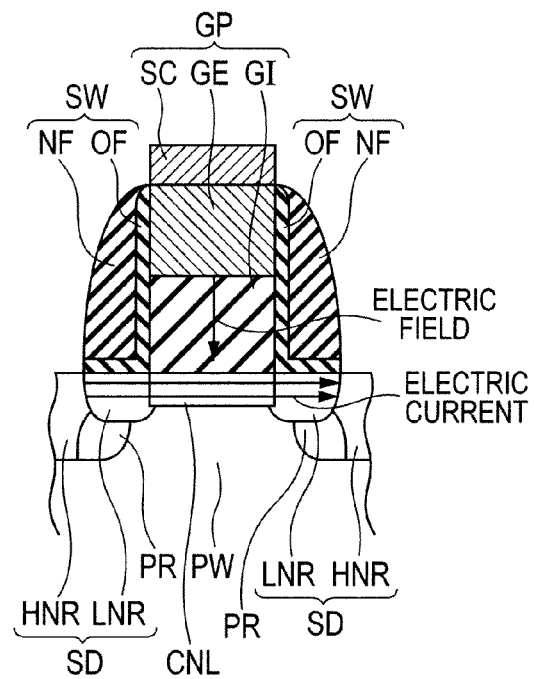

In the graph shown in FIG. 5A, the horizontal axis represents the intensity of electric field E applied to the gate insulating film GI of the MIS transistor in the thickness direction, and the vertical axis represents the intensity of spontaneous polarization P of the gate insulating film GI in the thickness direction. In FIG. 5A, the directions of the electric field E and polarization P are represented by positive or negative values. In a state where the intensity of the electric field E is shown to be 0 or close to 0 in FIG. 5A, no channel is formed in the region between the source and drain regions (between the $n^-$ regions LNR making up a pair of LDDs) of the MIS transistor as shown in FIG. 5B, i.e. the MIS transistor is in an OFF state. In a state where the intensity of the electric field E is shown to be widely away from 0 in either the positive or negative direction in FIG. 5A, a channel CNL is formed in the region between the source and drain regions (between the $n^-$ regions LNR making up a pair of LDDs) of the MIS transistor as shown in FIG. 5C, i.e. the MIS transistor is in an ON state. In the ON state as shown in FIG. 5C, the absolute value of polarization P (see FIG. 5A) in the gate insulating film GI has grown large causing the channel CNL to be formed under the gate insulating film GI.

Referring to FIG. 5A, assume that the absolute value of the electric field E is increased either in the positive or negative direction from an OFF state in which the electric field E and polarization P are both at 0 by applying a positive or negative voltage to the gate electrode GE. Initially, as the absolute value of the electric field E gradually increases, the absolute value of polarization P increases also gradually. When the electric field E reaches a threshold value th1, however, the absolute value of polarization P sharply increases to generate an ON state where the channel CNL has been formed. When, in the ON state, the absolute value of the electric field E is gradually decreased, the absolute value of polarization P also decreases gradually until the electric field reaches a threshold value th2. When the threshold value th2 is reached, the absolute value of polarization P sharply decreases to cause the ON state to change to an OFF state where the channel CNL has disappeared. Thus, switching the MIS transistor to an ON state requires the absolute value of the electric field E to be increased to a certain level, and switching the MIS transistor to an OFF state requires the absolute value of the electric field E to be decreased to a certain level. Hence, the MIS transistor having an anti-ferroelectric film has a double hysteresis characteristic as shown in FIG. 5A.

A Schmitt trigger circuit is a flip-flop circuit having such a double hysteresis characteristic. To be more concrete, a Schmitt trigger circuit is a flip-flop circuit in which upper and lower limit values of an input voltage serve as two threshold input voltage levels to cause the state of the circuit to change when the input voltage increases to above the upper threshold level or decreases to below the lower threshold level. A single Schmitt trigger circuit can be represented as shown in FIG. 6A which can be represented by a more detailed equivalent circuit as shown in FIG. 6B. A Schmitt trigger circuit includes a NOT circuit 3a and a NOT circuit 3b which is directed oppositely to the NOT circuit 3a and series-connected to a resistor 4 to be parallel to the NOT circuit 3a.

A Schmitt trigger circuit is used in many cases to shape an input waveform into a neat square waveform (i.e. for shaping an analog-like digital signal waveform). In shaping an analog-like digital signal waveform, a slowly changing input signal which, for example, gently changes repeatedly going up and down or which includes noise is shaped into a steep square waveform.

Even in a digital circuit, a change from 0 to 1 is not instantaneous, and it takes time. When a 0-to-1 signal is inputted to an inverter, the inverter output changes from 1 to 0 at an instant when the input signal exceeds a threshold level. In reality, the threshold level itself varies delicately due to, for example, variations in temperature and supply voltage. The input voltage also changes not instantaneously but gradually. Therefore, the inverter output returns to 1 immediately after changing from 1 to 0. Namely, it is eventually set to 0 only after chattering between 1 and 0.

Such chattering can be avoided by using a Schmitt trigger circuit. In reality, a Schmitt trigger circuit receives an external input signal which easily bears noise. Generally, to convert an analog input signal into a digital-like square waveform, a Schmitt trigger circuit is included in the input part of a comparator.

If, in such an application, an input signal is inputted using no Schmitt trigger circuit, software repeats processing for 0 and 1 to eventually cause a hardware error. Particularly, when an input signal with large noise is inputted as it is to a comparator, the rising part of the waveform is caused to repeat an ON state and an OFF state many times.

Furthermore, Schmitt trigger circuits are known to be highly noise-resistant, so that they are widely used as measures against software errors.

Configuring an existing type of Schmitt trigger circuit requires two or three bipolar transistors and resistor elements. According to the present invention, however, a single MIS transistor having a gate insulating film of an antiferroelectric material can realize a characteristic identical to that of a Schmitt trigger circuit, so that it can replace a Schmitt trigger circuit. Using such a MIS transistor is, therefore, effective in reducing the area of a semiconductor integrated circuit and improving the reliability of the semiconductor integrated circuit.

Referring to FIG. 5C again, the MIS transistor having the gate insulating film GI of an antiferroelectric material can increase, in an ON state, the electrostatic capacitance of the MIS laminated structure including the gate insulating film GI thanks to the high dielectric constant of the antiferroelectric material and can thereby enhance the field effect of the MIS transistor. As a result, the channel CNL is formed in the region between the source region and the drain region to allow electric current to flow as indicated by arrows in FIG. 5C. The gate insulating film GI having a high dielectric constant can be made thick while inhibiting the electrostatic capacity of the MIS laminated structure from decreasing. When the gate insulating film GI is thick (for example, 2 nm or more), it is possible to inhibit generation of a leakage current to flow, in an ON state, through the gate insulating film GI in its thickness direction (indicated by an arrow in FIG. 5C). Therefore, even in cases where, as a result of further miniaturization of semiconductor integrated circuits, the gate electrode GE is made 45 nm or shorter (for example, like a gate electrode of the so-called 28-nm generation), the gate insulating film GI can be made 2 nm or thicker. Hence, generation of a leakage current to flow, in an ON state, through the gate insulating film GI in its thickness direction can be inhibited. Since switching the MIS transistor from an OFF state to an ON state requires application of a considerably large electric field E, the MIS transistor can be inhibited from being erroneously switched to an ON state.

In an OFF state, the intensity of polarization P in the gate insulating film GI decreases, so that the channel CNL is not formed. It is, therefore, possible to inhibit undesired generation of a leakage current to flow from the source region to the drain region in an OFF state. Since switching the MIS transistor from an ON state to an OFF state requires the electric field E to be made considerably small, the MIS transistor can be inhibited from being erroneously switched to an OFF state.

As described above, the MIS transistor of the present embodiment having a gate insulating film GI which includes an antiferroelectric material and a gate electrode miniaturized to measure 45 nm or less in length can securely form a channel in an ON state to allow a drive current to flow while allowing no leakage current to flow through the gate insulating film GI. In an OFF state, the MIS transistor can securely cause the channel to disappear, thereby inhibiting generation of a leakage current to flow from the source region to the drain region. The MIS transistor can, therefore, enhance the effect to inhibit software errors.

When the thickness of the gate insulating film is made 50 nm or less, the aspect ratio of a MIS transistor of the so-called 28-nm generation, i.e. the ratio of the thickness H (see FIG. 4) of the gate portion GP to the length L (see FIG. 4) of the gate electrode, can be made 2 or larger but smaller than 4. In this way, the possibility of the side wall insulating layers SW formed over the side walls of the gate portion PE being damaged by stress generated when they are chemically mechanically polished can be reduced.

Figure 7A:
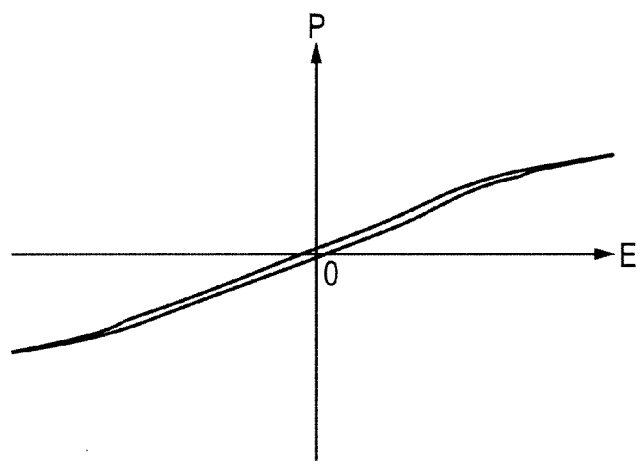
FIGS. 7A to 7C concern a first comparison example for the first embodiment of the present invention.
Figure 7B:
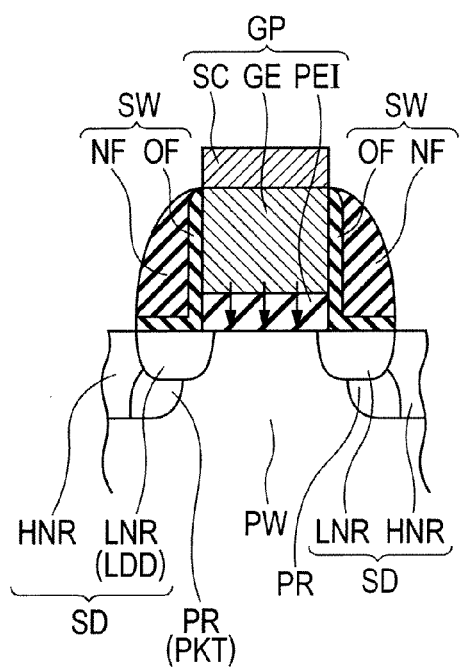
Figure 7C:
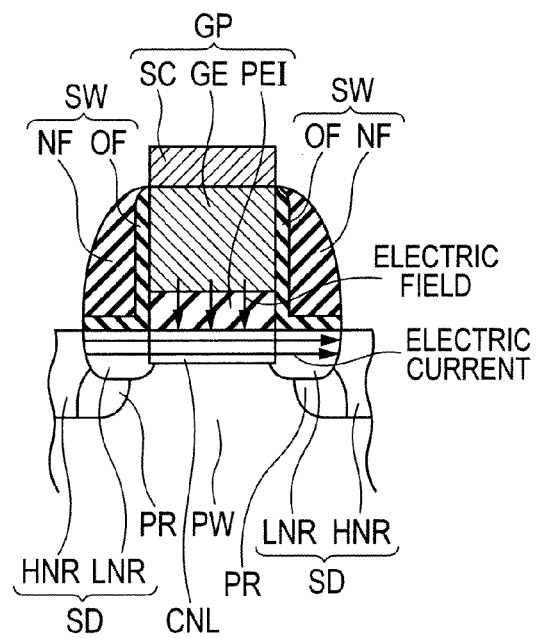

FIG. 7A shows, similarly to FIG. 5A, the relationship between the electric field and polarization of a gate insulating film PEI included in a MIS transistor which has a structure basically similar to that of the present embodiment and whose gate insulating film PEI has a paraelectric film, for example, a silicon oxide film. FIG. 7B shows the MIS transistor having a paraelectric film, represented in FIG. 7A, in an OFF state. FIG. 7C shows the MIS transistor having a paraelectric film, represented in FIG. 7A, in an ON state.

Referring to FIGS. 7A to 7C, when the absolute value of the electric field E applied to the gate insulating film PEI is small, the absolute value of polarization P in the gate insulating film PEI is also small, so that no channel is formed causing the MIS transistor to remain in an OFF state. When the absolute value of the electric field E applied to the gate insulating film PEI is increased, the absolute value of polarization P in the gate insulating film PEI also increases almost proportionally, eventually causing the channel CNL to be formed to switch the MIS transistor to an ON state. Referring to FIG. 7A, the curve representing the increasing absolute value of the electric field E and the curve representing the decreasing absolute value of the electric field E are not much shifted from each other, that is, the hysteresis characteristic is small.

Since the dielectric constant of a paraelectric film is relatively small, however, in order to increase the electrostatic capacity of the MIS laminated structure particularly when the length of the gate electrode GE is reduced as a result of further advancement of semiconductor integrated circuit miniaturization, it is necessary to reduce the thickness of the gate insulating film PEI. When the thickness of the gate insulating film PEI is reduced to be comparable to the total thickness of several atoms, the leakage current, attributable to the voltage applied to the gate electrode GE whether in an ON state or in an OFF state, flowing through the gate insulating film PEI in its thickness direction (indicated by arrows in FIGS. 7B and 7C) possibly increases.

Figure 8A:
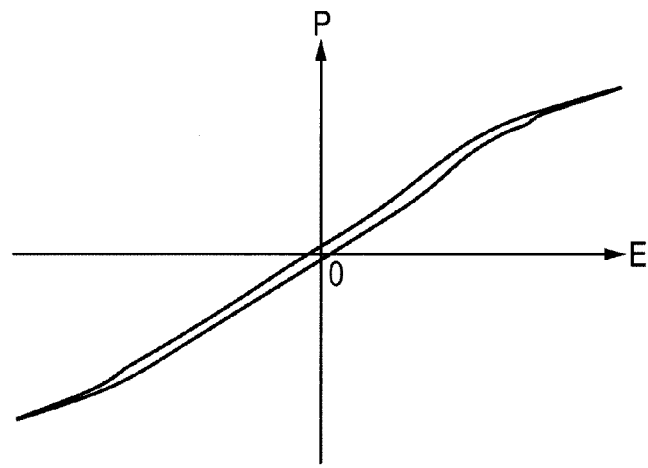
FIGS. 8A to 8C concern a second comparison example for the first embodiment of the present invention.
Figure 8B:
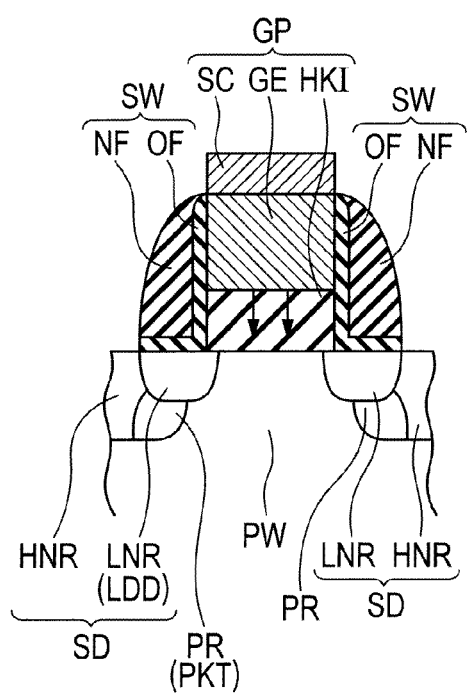
Figure 8C:
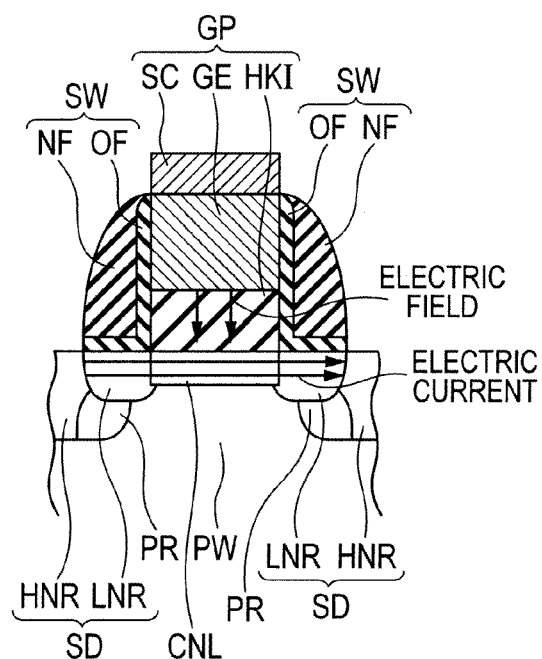

FIG. 8A shows, similarly to FIG. 5A, the relationship between the electric field and polarization of a gate insulating film HKI included in a MIS transistor which has a structure basically similar to that of the present embodiment and whose gate insulating film HKI has a high dielectric constant film with a higher dielectric constant than that of a paraelectric material. FIG. 8B shows the MIS transistor having a high dielectric constant film, represented in FIG. 8A, in an OFF state. FIG. 8C shows the MIS transistor having a high dielectric constant film, represented in FIG. 8A, in an ON state. Using a high dielectric constant film with a higher dielectric constant than that of a paraelectric material makes it possible to increase the electrostatic capacitance of the MIS laminated structure, so that the gate insulating film HKI can be made thick compared to the gate insulating film PEI. As a result, compared with the case of the gate insulating film PEI, the leakage current flowing through the gate insulating film HKI in its thickness direction can be reduced. In this MIS transistor, however, problems tend to develop in the interface (contact face) between the gate electrode GE of polycrystal silicon and the gate insulating film HKI in the MIS laminated structure. This possibly causes the operating voltage of the MIS transistor to increase.

Figure 9A:
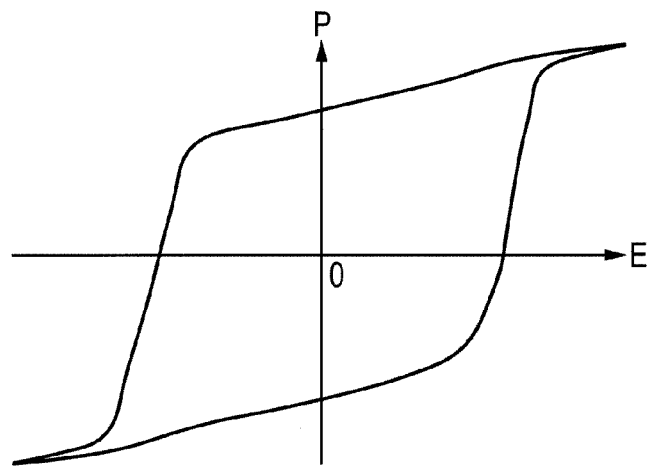
FIGS. 9A to 9C concern a third comparison example for the first embodiment of the present invention.
Figure 9B:
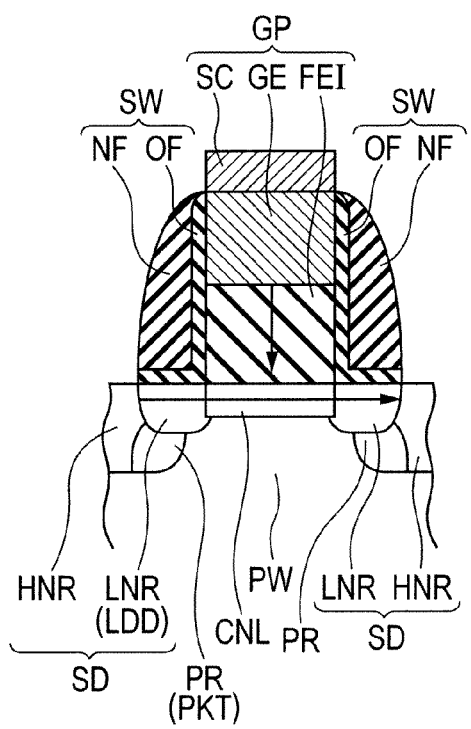
Figure 9C:
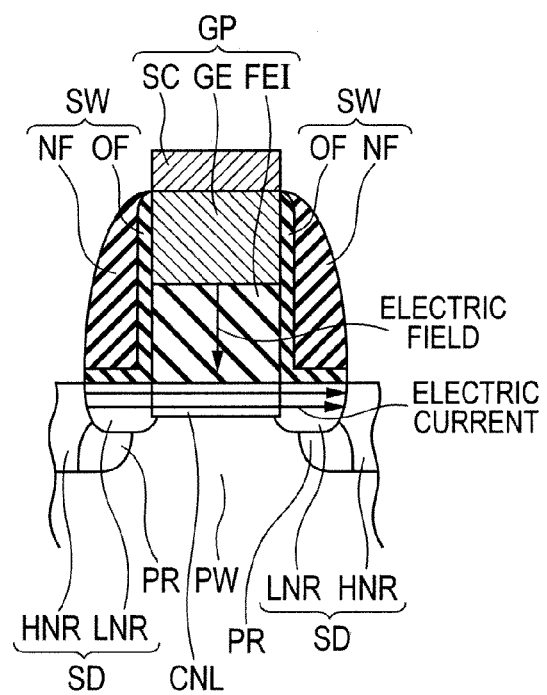

FIG. 9A shows, similarly to FIG. 5A, the relationship between the electric field and polarization of a gate insulating film FEI included in a MIS transistor which has a structure basically similar to that of the present embodiment and whose gate insulating film FEI has a ferroelectric film with a higher dielectric constant than that of a paraelectric material. FIG. 9B shows the MIS transistor having a ferroelectric film, represented in FIG. 9A, in an OFF state. FIG. 9C shows the MIS transistor having a ferroelectric film, represented in FIG. 9A, in an ON state. Using a ferroelectric film with a higher dielectric constant than that of a paraelectric material makes it possible to make the gate insulating film FEI thick and reduce the leakage current flowing through the gate insulating film FEI in its thickness direction (indicated by an arrow in FIGS. 9B and 9C).

As shown in FIG. 9A, however, the ferroelectric film has a strong hysteresis characteristic. Therefore, even when the MIS transistor switched to an ON state by applying a large electric field E is switched to an OFF state by weakening the electric field E to 0, polarization P remains without being correspondingly reduced. Hence, as shown in FIG. 9B, the channel CNL remains even with the MIS transistor switched to an OFF state. This possibly causes generation of a leakage current flowing from the source region to the drain region.

According to the present embodiment, a MIS transistor using a gate insulating film GI including an antiferroelectric film can inhibit the above-described problems.

Second Embodiment

A second embodiment of the present invention differs from the first embodiment in that a capacitance is formed in the MIS transistor. The structure of the second embodiment will be described below.

Figure 10:
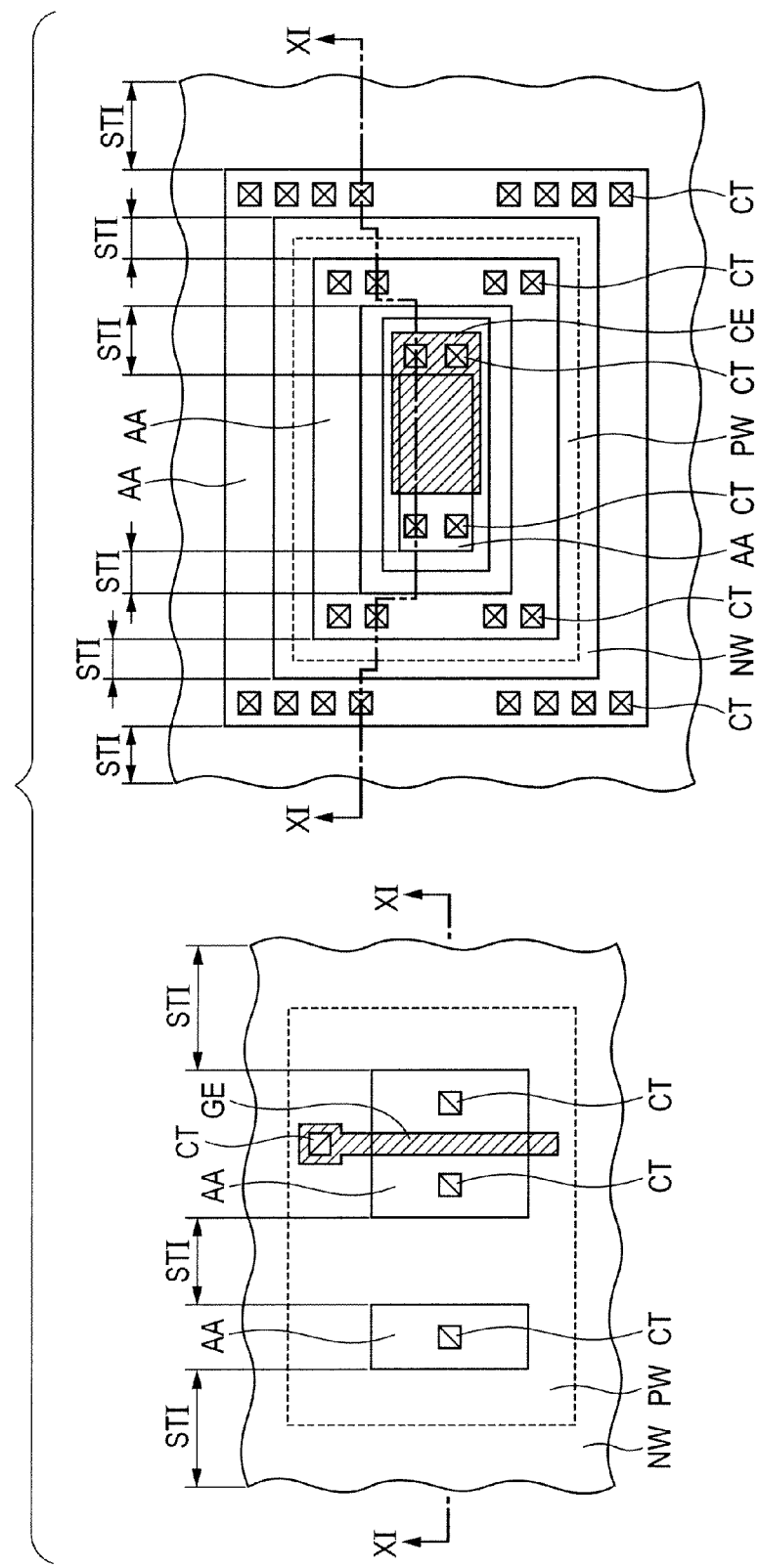
FIG. 10 is a schematic plan view showing a first example structure of a MIS capacitance formed along with an nMIS transistor according to a second embodiment of the present invention.
Figure 11:
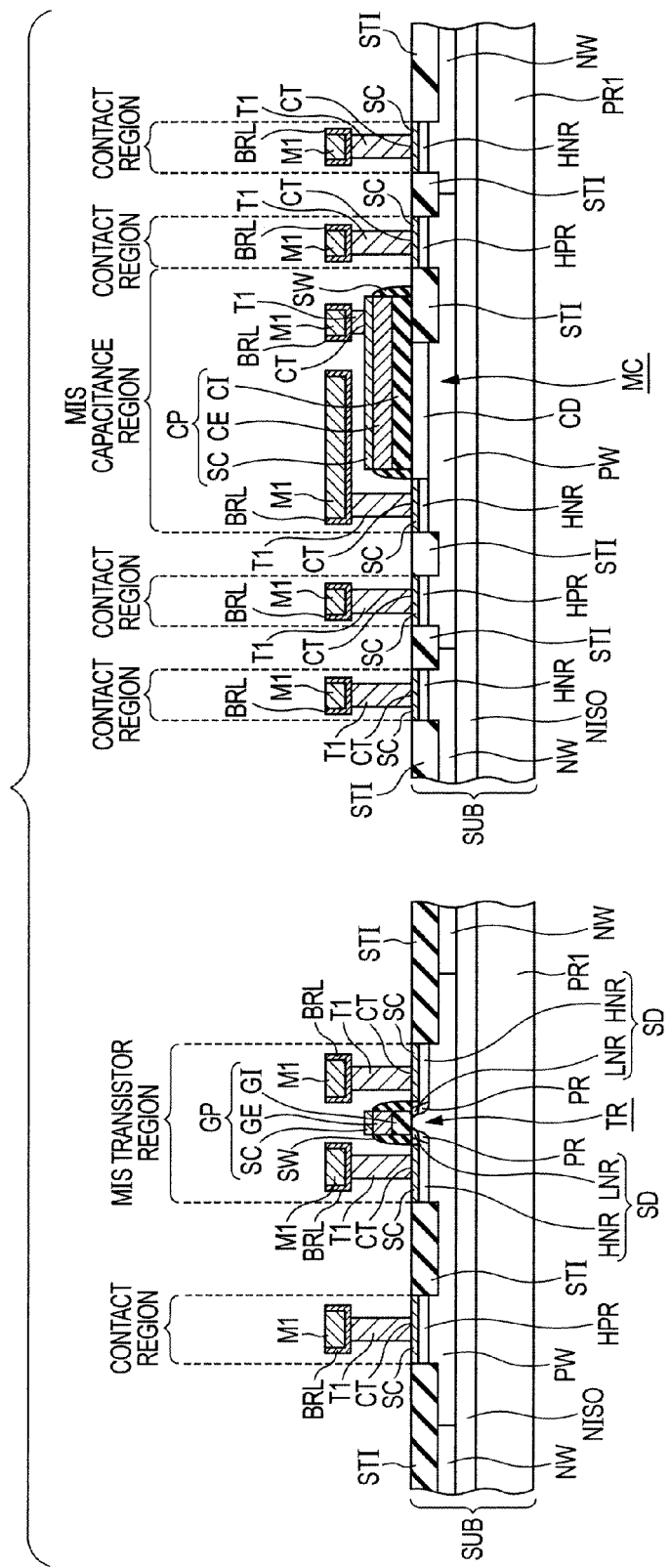
FIG. 11 is a schematic sectional view showing the structure along line XI-XI of FIG. 10.

Referring to FIGS. 10 and 11 showing a first example of the present embodiment, the semiconductor substrate SUB on which the MIS transistor shown in FIGS. 2A and 2B is formed includes a capacitive element called a MIS capacitance. Namely, the region shown on the left in FIGS. 10 and 11 is the same as the region where the MIS transistor shown in FIGS. 2A and 2B is formed, and a MIS capacitance region is formed as shown on the right in FIGS. 10 and 11.

In the semiconductor substrate SUB, an n-type isolation layer NISO is formed over the p-type impurity region PR1 included in the region where the MIS capacitance is formed. Over the n-type isolation layer NISO, an n-type well region NW and a p-type well region PW are formed. As shown in the plan view of FIG. 10, the n-type well region NW is formed to surround the p-type well region PW and is electrically isolated from other elements by trench isolation structures STI.

Referring to the plan view in FIG. 10, plural (for example, three) active areas AA are formed over the surface, in the n-type well region NW and p-type well region PW between trench isolation structures STI, of the semiconductor substrate SUB. Of the active areas AA shown in FIG. 10, the outer ones are formed to have, as seen from above, a rectangular contour including an inner hollow portion so as to make connection with wiring above the active areas AA easier, whereas the central active area shown in the plan view in FIG. 10 is formed rectangularly with no hollow portion. Namely, the active areas AA may be arbitrarily formed as seen from above. The outer and inner active areas AA are mutually isolated by trench isolation structures STI.

FIG. 11 shows sectional structures along bent lines XI-XI in FIG. 10. Referring to FIG. 11, in the active areas AA for contacts (contact areas), $p^+$ regions HPR are formed over the surface of the p-type well region PW, and $n^+$ regions HNR are formed over the surface of the n-type well region NW. The $p^+$ regions HPR and $n^+$ regions HNR function as contact areas for fixing the potentials in the p-type well region PW and n-type well region NW, respectively. Over the surface of the p-type well region PW in the active area AA for capacitance (MIS capacitance region), a MIS capacitance MC is formed. The MIS capacitance MC includes an impurity region CD for capacitance, a dielectric film CI for capacitance, an electrode CE for capacitance, a silicide layer SC, and a pair of side wall insulating layers SW.

The impurity region CD for capacitance is formed over the surface of the p-type well region PW in the active area AA of the MIS capacitance region. Over the surface of the p-type well region PW in the active area AA of the MIS capacitance region, an $n^+$ region HNR and a silicide layer SC are formed adjacently to the impurity region CD for capacitance. The $n^+$ region HNR and the silicide layer SC are disposed for electrical connection to wiring M1 via a contact CT and a conductive layer T1.

The dielectric film CI for capacitance is formed over the impurity region CD for capacitance. The electrode CE for capacitance made of, for example, polycrystal silicon is formed to be in contact with the upper surface of the dielectric film CI for capacitance. The dielectric film CI for capacitance and the electrode CE for capacitance form a capacitive element (MIS capacitance MC) between themselves and the impurity region CD for capacitance. The electrode CE for capacitance is a rectangular electrode formed to partly overlap, as seen from above, with the central active area AA shown in FIG. 10.

Over the side walls of the laminated structure comprised of the dielectric film CI for capacitance and the electrode CE for capacitance, side wall insulating layers SW of, for example, silicon oxide film or silicon nitride film are formed. Over the surface of the p$^+$ regions HPR and the n$^+$ regions HNR, a silicide layer SC made of $CoSi_2$ or $NiSi_2$ may be formed. As shown in FIG. 11, a silicide layer SC may also be formed over the upper surface of the electrode CE for capacitance, but the electrode CE for capacitance with no silicide layer SC formed thereover is also allowable. The laminated structure comprised of the dielectric film CI for capacitance, electrode CE for capacitance and silicide layer SC as shown in FIG. 11 makes up a capacitance portion CP of the MIS capacitance MC. As in the region where the MIS transistor is formed, conductive layers T1 and wirings M1 are also formed, but the wirings M1 are omitted in FIG. 10.

Figure 12:
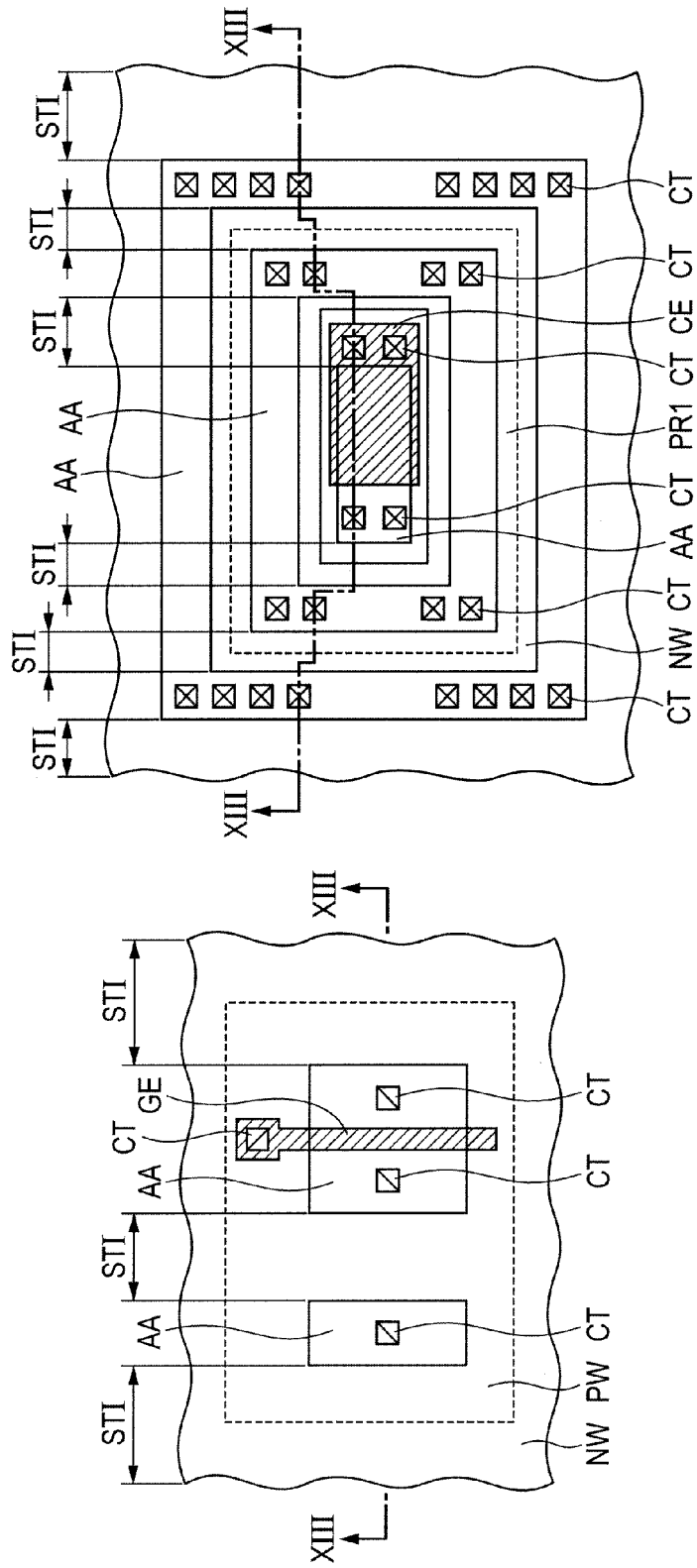
FIG. 12 is a schematic plan view showing a second example structure of a MIS capacitance formed along with an nMIS transistor according to the second embodiment of the present invention.
Figure 13:
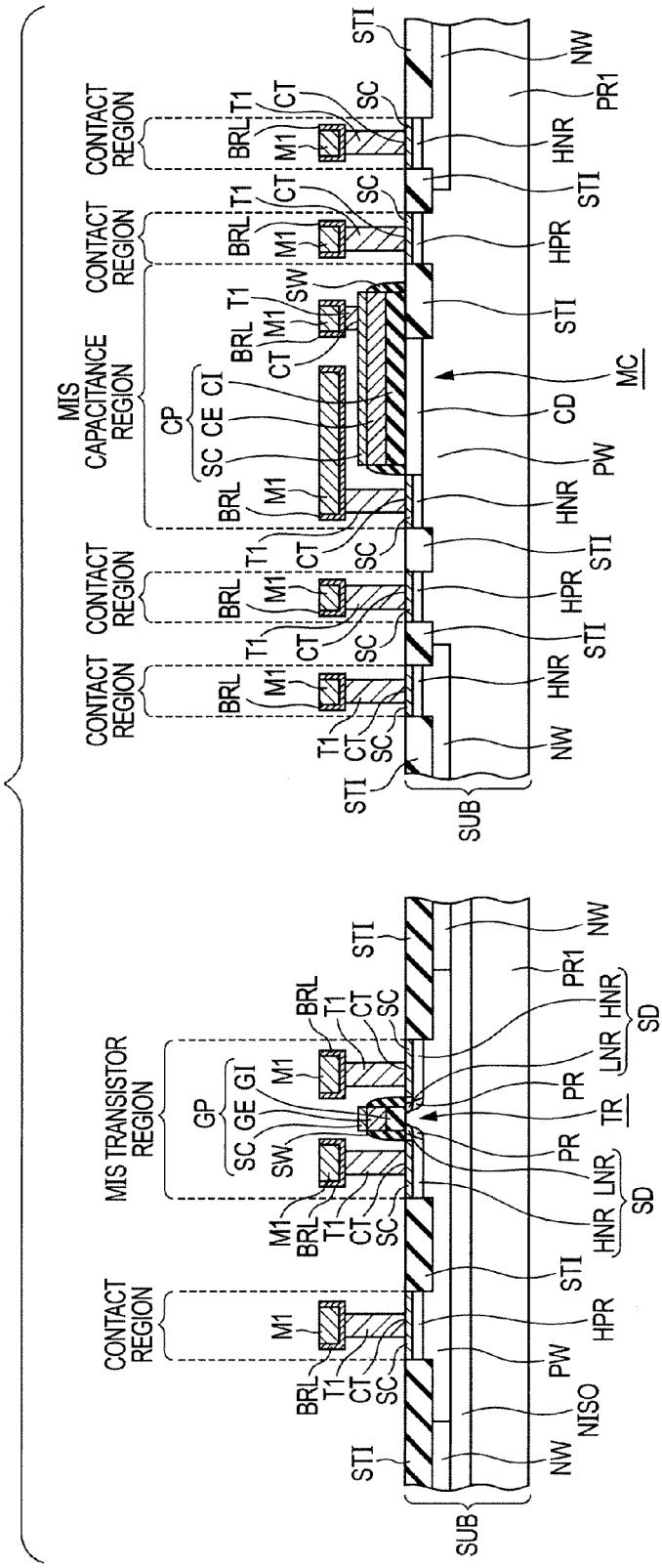
FIG. 13 is a schematic sectional view showing the structure along line XIII-XIII of FIG. 12.

Referring to FIGS. 12 and 13 showing a second example of the present embodiment, the n-type isolation layer NISO and the p-type well region PW shown in FIGS. 10 and 11 are not included in the MIS capacitance MC of the second example. For example, the impurity region CD for capacitance shown in an inner portion of FIG. 13 is formed directly in the p-type impurity region PR1 of the semiconductor substrate SUB. This is the only difference between FIGS. 12 and 13 and FIGS. 10 and 11. In the other respects, FIGS. 12 and 13 are identical to FIGS. 10 and 11. Hence, in FIGS. 12 and 13, elements identical to those shown in FIGS. 10 and 11 are denoted by reference symbols identical to those used in FIGS. 10 and 11, and their descriptions will not be repeated.

Figure 14:
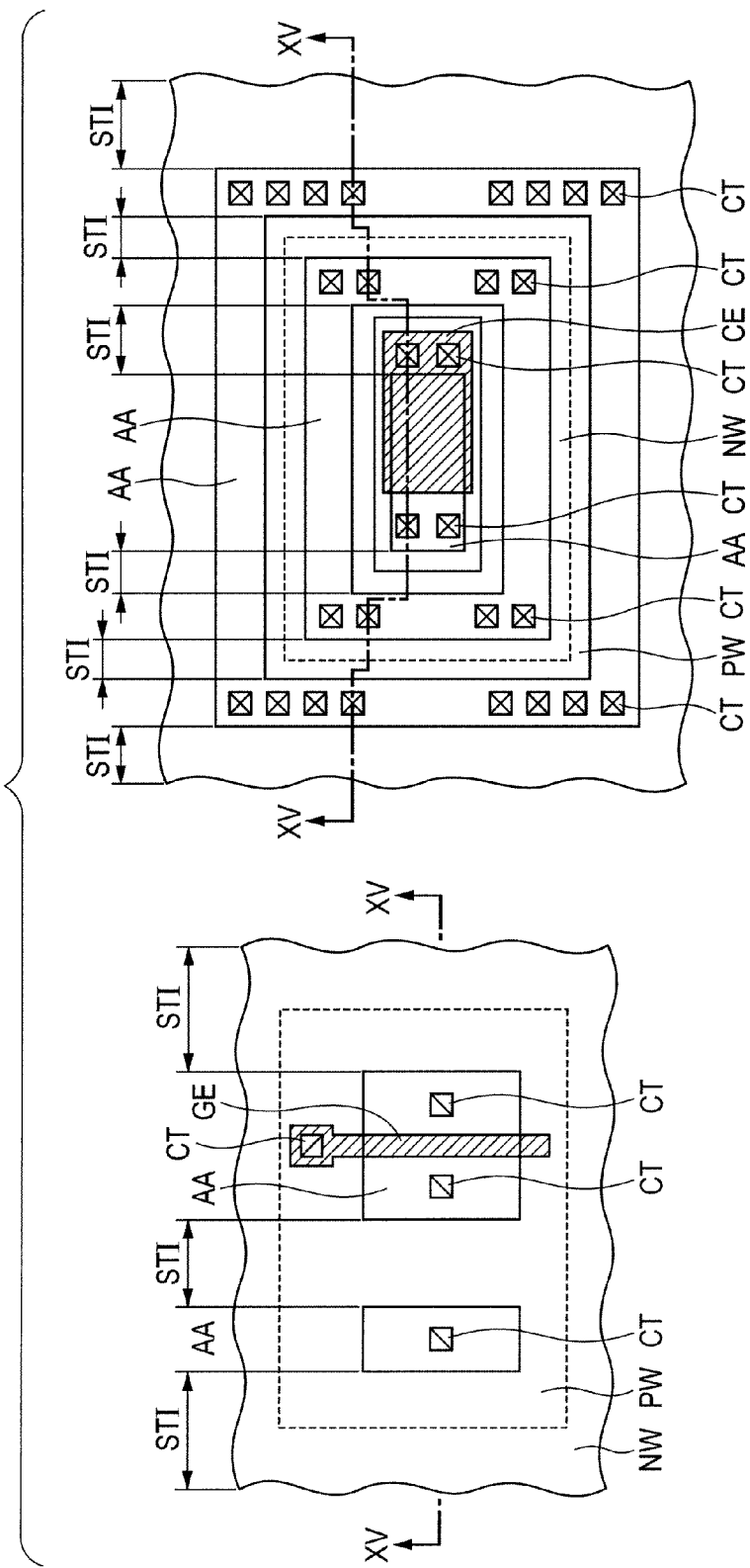
FIG. 14 is a schematic plan view showing a third example structure of a MIS capacitance formed along with an nMIS transistor according to the second embodiment of the present invention.
Figure 15:
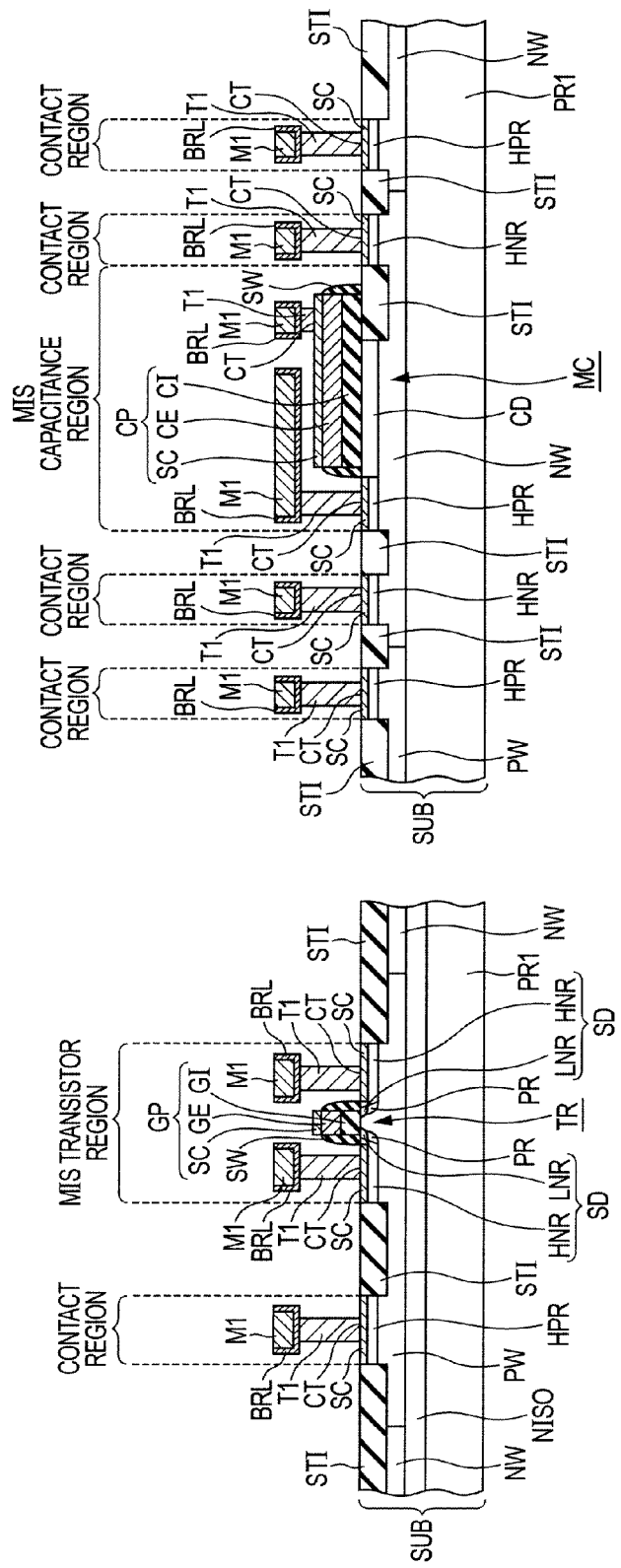
FIG. 15 is a schematic sectional view showing the structure along line XV-XV of FIG. 14.

Referring to FIGS. 14 and 15 showing a third example of the present embodiment, the MIS capacitance MC of the third example differs from the MIS capacitance MC shown in FIGS. 10 and 11 in that the impurities contained in the well region formed over the main surface on one side of the semiconductor substrate SUB and in the MIS capacitance region and contact areas differ, in conductivity type, from those used in the MIS capacitance MC shown in FIGS. 10 and 11. To be more concrete, in the MIS capacitance region and the peripheral contact areas shown in FIG. 15, a p-type well region PW is formed where an n-type well region NW is formed in the case of the MIS capacitance MC shown in FIG. 11, and an n-type well region NW is formed where a p-type well region PW is formed in the case of the MIS capacitance MC shown in FIG. 11. Also, in the MIS capacitance region and the peripheral contact areas shown in FIG. 15, p$^+$ regions HPR are formed where n$^+$ regions HNR are formed in the case of the MIS capacitance MC shown in FIG. 11, and n$^+$ regions HNR are formed where p$^+$ regions HPR are formed in the case of the MIS capacitance MC shown in FIG. 11.

FIGS. 14 and 15 differ from FIGS. 10 and 11 only in the above respects. In the other respects, FIGS. 14 and 15 are identical to FIGS. 10 and 11. Hence, in FIGS. 14 and 15, elements identical to those shown in FIGS. 10 and 11 are denoted by reference symbols identical to those used in FIGS. 10 and 11, and their descriptions will not be repeated.

Figure 3C:
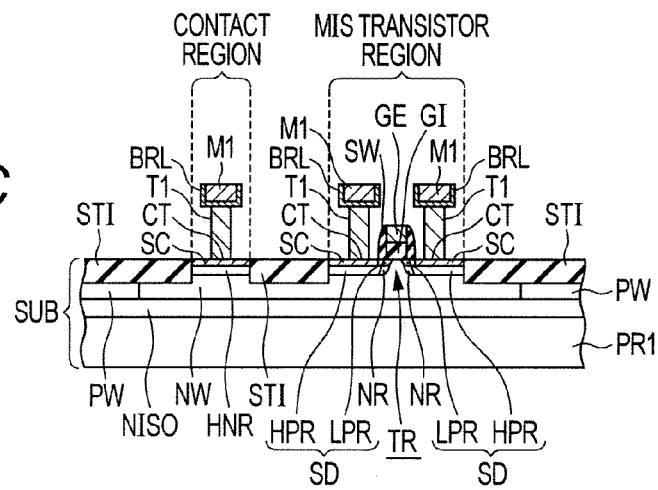

Note that, even though, in FIGS. 10 to 15, the MIS capacitance MC is shown formed on the semiconductor substrate SUB having the MIS transistor shown in FIGS. 2A to 2C, the MIS capacitance MC may be formed, for example, on the semiconductor substrate SUB having the MIS transistor shown in FIGS. 3A to 3C.

The dielectric film CI for capacitance included in the MIS capacitance MC of the present embodiment preferably has an antiferroelectric film. To be specific, the dielectric film for capacitance is preferably made of at least one selected from a group of $Pb(In_{0.5}Nb_{0.5})O_3$, $NbNaO_3$, lead zirconate ($ZrPbO_3$), lead lanthanum zirconate titanate ($TiZrLaPbO_3$), lead zirconate titanate ($TiZrPbO_3$), $NH_4H_2PO_4$, and $NH_4H_2AsO_4$.

The structure of the present embodiment differs from the structure of the first embodiment in the above respects. In the other respects, the present embodiment is identical to the first embodiment. Therefore, the elements identical between the two embodiments are denoted by identical reference symbols and their descriptions are not repeated.

Next, operations and advantageous effects of the present embodiment will be described. In addition to the operations and advantageous effects of the first embodiment, the present embodiment has the following advantageous effects.

In the present embodiment, the MIS capacitance MC used in combination with a MIS transistor has an antiferroelectric film. Therefore, when the MIS capacitance element enters an ON state causing a strong electric field to be applied to the dielectric film CI for capacitance having an antiferroelectric film, the spontaneous polarization of the dielectric film CI for capacitance increases with the antiferroelectric film having a high dielectric constant. This allows more electric charges to be charged to the MIS capacitance MC at high speed. Conversely, when the MIS capacitance element enters an OFF state, the spontaneous polarization of the dielectric film CI for capacitance decreases with the antiferroelectric film having a double hysteresis characteristic. This allows the electric charges accumulated in the MIS capacitance MC to be discharged at high speed. Hence, using an antiferroelectric film as the dielectric film CI for capacitance makes it possible to provide a MIS capacitance element capable of charging and discharging at high speed.

When the MIS capacitance has a paraelectric film, the charging/discharging speed may decrease with the paraelectric film having a small dielectric constant. When the MIS capacitance has a ferroelectric film, switching the MIS capacitance to an OFF state does not adequately decrease the spontaneous polarization of the ferroelectric film with the ferroelectric film having a strong hysteresis characteristic, so that smooth discharging may be inhibited.

The second embodiment of the present invention differs from the first embodiment of the present invention only in the above regards. The structure, conditions, procedures, and advantageous effects, not described above, of the second embodiment are similar to those of the first embodiment.

Third Embodiment

A third embodiment of the present invention differs from the first embodiment in that a variable capacitance is formed. The structure of the third embodiment will be described below.

Figure 16:
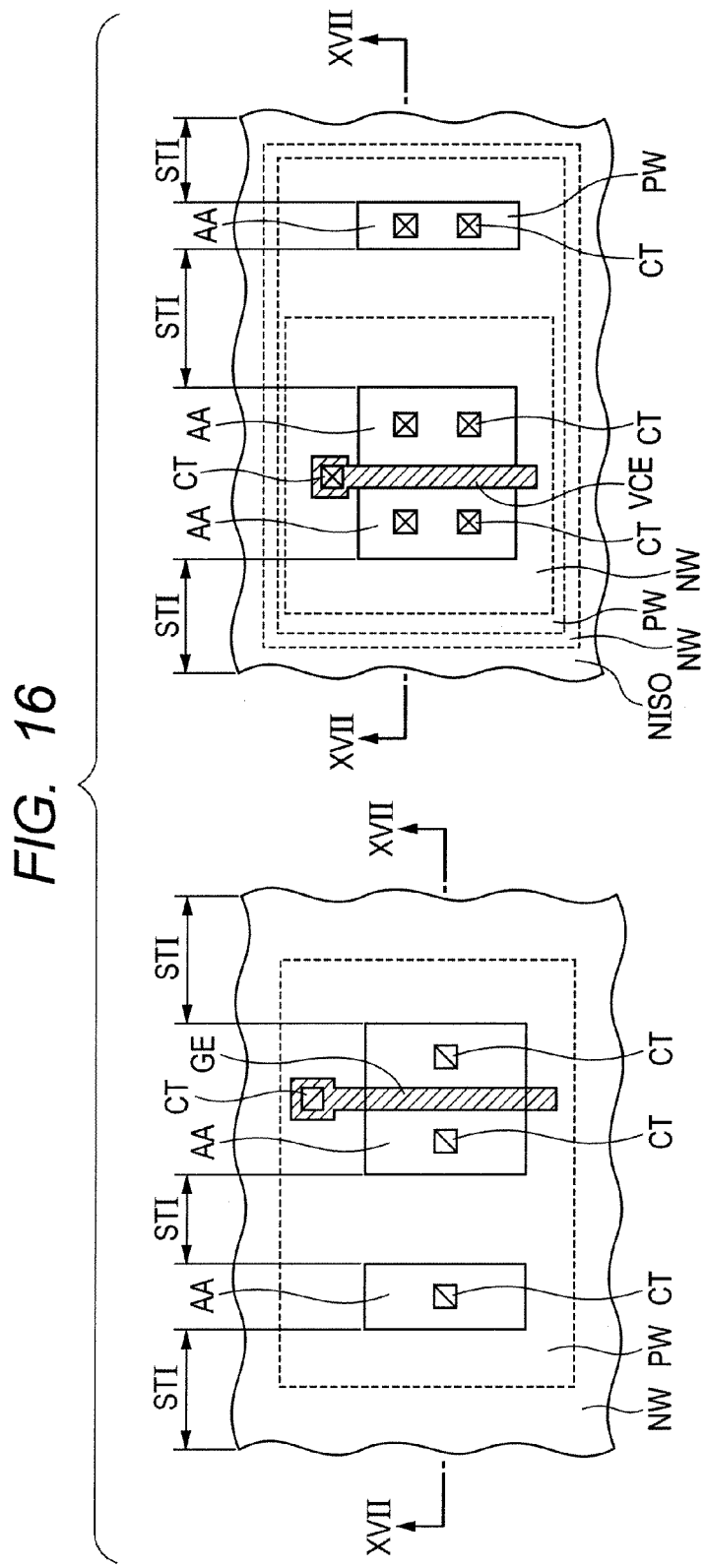
FIG. 16 is a schematic plan view showing a first example structure of a variable capacitance formed along with an nMIS transistor according to a third embodiment of the present invention.
Figure 17:
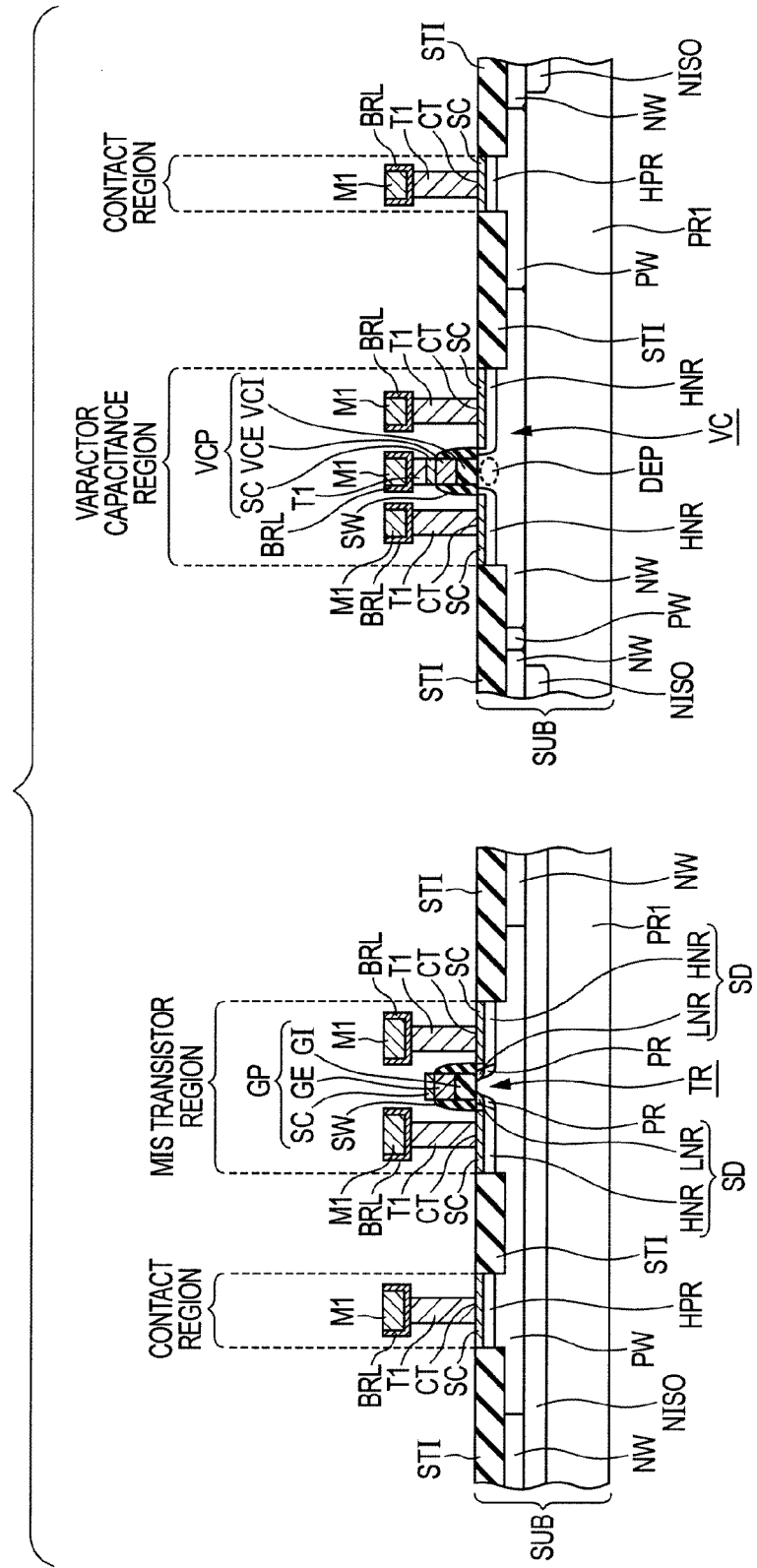
FIG. 17 is a schematic sectional view showing the structure along line XVII-XVII of FIG. 16.

Referring to FIGS. 16 and 17 showing a first example of the third embodiment, a variable capacitance element called a varactor capacitance is additionally formed over the semiconductor substrate SUB over which the MIS transistor shown in FIGS. 2A and 2B is formed. Namely, the region shown on the left in FIGS. 16 and 17 is identical to the region where the MIS transistor shown in FIGS. 2A and 2B is formed. In the first example of the present embodiment, the region shown on the right in FIGS. 10 and 11 is added to the region shown on the left.

In the semiconductor substrate SUB, n-type well regions NW and p-type well regions PW are formed over the portion where the varactor capacitance is formed of the p-type impurity region PR1. Referring to the sectional view shown in FIG. 17, the n-type well regions NW and p-type well regions PW are alternately arranged in a direction along the main surface of the semiconductor substrate SUB. The active area AA for varactor capacitance formation and the active areas AA for contacts are mutually isolated using trench isolation structures STI.

Referring to FIG. 17, over the surface of the p-type well region PW in each active area AA for contact (contact area), a p+ region HPR is formed. The p+ region HPR functions as a contact area for fixing the potential of the p-type well region PW. Over the surface of the n-type well region NW in the active area AA for varactor capacitance (varactor capacitance region), a varactor capacitance VC is formed. The varactor capacitance VC has a pair of n+ regions HNR, a pair of silicide layers SC, a dielectric film VCI for variable capacitance, an electrode VCE for variable capacitance, a silicide layer SC, and a pair of side wall insulating layers SW.

The pair of n+ regions HNR as well as the pair of silicide layers SC are spaced apart from each other over the surface of the n-type well region NW in the active area AA for varactor capacitance. These n+ regions HNR and silicide layers SC are disposed for electrical connections with wirings M1 via contacts CT and conductive layers T1.

Referring to the sectional view of FIG. 17, in the n-type well region NW in the varactor capacitance region, a depletion layer region DEP is formed between the pair of n+ regions HNR. The depletion layer region DEP is where a depletion layer is formed depending on the voltage applied when the varactor capacitance is in an ON state. In the n-type well region NW, a region below the depletion layer region DEP functions as an impurity region for variable capacitance. Namely, the dielectric film VCI for variable capacitance is formed over the impurity region for variable capacitance with the depletion layer region DEP formed between them. The electrode VCE for variable capacitance made of, for example, polycrystal silicon including p-type impurities is formed to be in contact with the upper surface of the dielectric film VCI for variable capacitance. The electrode VCE for variable capacitance and the impurity region for variable capacitance arranged to sandwich the dielectric film VCI for variable capacitance make up a variable capacitance (varactor capacitance).

The varactor capacitance is a capacitance element the capacitance of which largely varies, when a reverse voltage is applied thereto, depending on the magnitude of the reverse voltage. In the varactor capacitance, the impurity concentration in the impurity region for variable capacitance and in the electrode VCE for variable capacitance linearly changes in the up-down direction (thickness direction) as seen in FIG. 17. By making use of the impurity concentration gradient in the impurity region for variable capacitance and the electrode VCE for variable capacitance, the thickness of the depletion layer formed in the depletion layer region DEP between the impurity region for variable capacitance and the electrode VCE for variable capacitance (in the n-type well region NW directly below the dielectric film VCI for variable capacitance) is varied so as to vary the magnitude of capacitance.

In the region where the varactor capacitance is formed, like in the region where the MIS transistor is formed, side wall insulating layers SW may be formed over the side walls of the laminated structure comprised of the dielectric film VCI for variable capacitance and the electrode VCE for variable capacitance. Also, over the surfaces of the p+ regions HPR and n+ regions HNR and also over the upper surface of the electrode VCE for variable capacitance, a silicide layer SC may be formed. Referring to FIG. 17, the laminated structure comprised of the dielectric film VCI for variable capacitance, the electrode VCE for variable capacitance, and the silicide layer SC makes up the variable capacitance portion VCP of the varactor capacitance. A wiring M1 may also be formed in a region overlapping, as seen from above, with the variable capacitance portion VCP of the varactor capacitance, and the wiring M1 and the variable capacitance portion VCP may be electrically connected via the conductive layer T1. Furthermore, an n-type isolation layer NISO may be formed near the external periphery, as seen from above, of the region shown on the right side of each of FIGS. 16 and 17.

The structure of the first example, shown in FIGS. 16 and 17, of the present embodiment differs, as described above, from the structure shown in FIGS. 10 and 11. In the other respects, the two structures are identical. Therefore, the elements identical between the two structures are denoted by identical reference symbols and their descriptions are not repeated.

Figure 18:
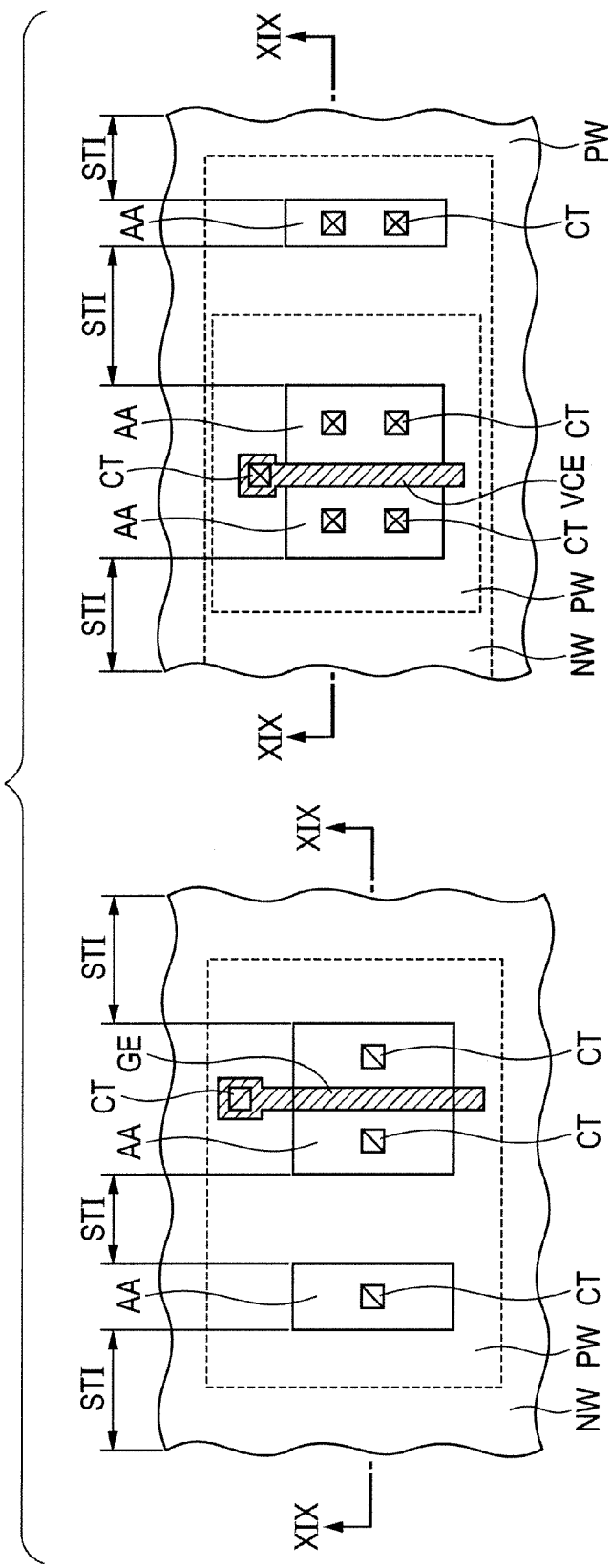
FIG. 18 is a schematic plan view showing a second example structure of a variable capacitance formed along with an nMIS transistor according to the third embodiment of the present invention.
Figure 19:
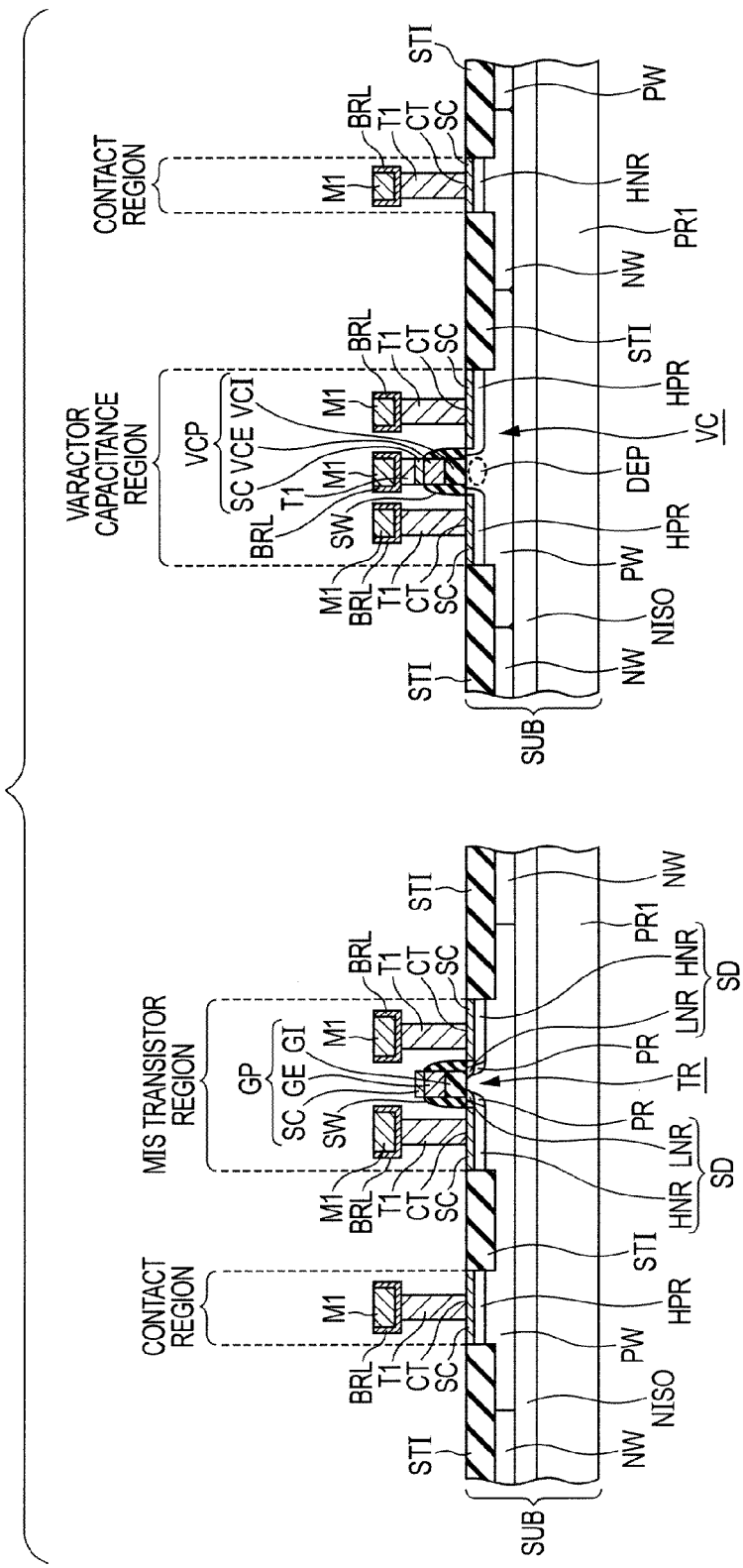
FIG. 19 is a schematic sectional view showing the structure along line XIX-XIX of FIG. 18.

Referring to FIGS. 18 and 19 showing a second example of the present embodiment, the varactor capacitance of the second example differs from the varactor capacitance shown in FIGS. 16 and 17 in that the impurities contained in the well region formed over the main surface on one side of the semiconductor substrate SUB and the varactor capacitance region and contact areas differ, in conductivity type, from those used in the varactor capacitance shown in FIGS. 16 and 17. Hence, in the second example, the n-type isolation layer NISO is formed between the semiconductor substrate SUB and the well regions. To be more concrete, in the second example shown in FIG. 19, a p-type well region PW is formed where, in the first example shown in FIG. 17, an n-type well region NW including the varactor capacitance region is formed, and an n-type well region NW is formed where, in the first example shown in FIG. 17, a p-type well region PW including a contact area is formed. Also, in the second example shown in FIG. 19, p+ regions HPR are formed where, in the first example shown in FIG. 17, n+ regions HNR are formed to be in the varactor capacitance region and peripheral contact areas, and an n+ region HNR is formed where, in the first example shown in FIG. 17, a p+ region HPR is formed.

FIGS. 18 and 19 differ from FIGS. 16 and 17 only in the above respects. In the other respects, FIGS. 18 and 19 are identical to FIGS. 16 and 17. Hence, in FIGS. 18 and 19, elements identical to those shown in FIGS. 16 and 17 are denoted by reference symbols identical to those used in FIGS. 16 and 17, and their descriptions will not be repeated.

A structure other than those shown in FIGS. 16 and 17 and FIGS. 18 and 19 may also be adopted in which a varactor capacitance according to the present embodiment is, like the MIS capacitance shown in FIG. 11, formed directly in the semiconductor substrate SUB containing p-type impurities. Even though in the structures shown in FIGS. 16 to 19, a varactor capacitance is formed in the semiconductor SUB having the MIS transistor shown in FIG. 2 formed therein, the varactor capacitance may be formed in the semiconductor substrate SUB having the MIS transistor shown in FIG. 3 formed therein.

The dielectric film VCI for variable capacitance included in the varactor capacitance of the present embodiment preferably has an antiferroelectric film. To be specific, the dielectric film for variable capacitance is preferably made of at least one selected from a group of $Pb(In_{0.5}Nb_{0.5})O_3$, $NbNaO_3$, lead zirconate ($ZrPbO_3$), lead lanthanum zirconate titanate ($TiZrLaPbO_3$), lead zirconate titanate ($TiZrPbO_3$), $NH_4H_2PO_4$, and $NH_4H_2AsO_4$.

The structure of the present embodiment differs, as described above, from the structure of the first embodiment. In the other respects, the present embodiment is identical to the first embodiment. Therefore, the elements identical between the two embodiments are denoted by identical reference symbols and their descriptions are not repeated.

Next, operations and effects of the present embodiment will be described. In addition to the operations and effects of the first embodiment, the present embodiment has the following effects.

In the present embodiment, the varactor capacitance used in combination with a MIS transistor has an antiferroelectric film. Therefore, when the varactor capacitance element enters an ON state causing a strong electric field to be applied to the dielectric film VCI for variable capacitance having an antiferroelectric film, the spontaneous polarization of the dielectric film VCI for variable capacitance increases with the antiferroelectric film having a high dielectric constant. This allows more electric charges to be charged to the varactor capacitance at high speed. Conversely, when the varactor capacitance element enters an OFF state, the spontaneous polarization of the dielectric film VCI for variable capacitance decreases with the antiferroelectric film having a double hysteresis characteristic. This allows the electric charges accumulated in the varactor capacitance to be discharged at high speed. Hence, using an antiferroelectric film as the dielectric film VCI for variable capacitance makes it possible to provide a varactor capacitance element capable of charging and discharging at high speed.

When the varactor capacitance has a paraelectric film, the charging/discharging speed may decrease with the paraelectric film having a small dielectric constant. When the varactor capacitance has a ferroelectric film, switching the varactor capacitance to an OFF state does not adequately decrease the spontaneous polarization of the ferroelectric film with the ferroelectric film having a strong hysteresis characteristic, so that smooth discharging may be inhibited.

The third embodiment of the present invention differs from the first and second embodiments of the present invention only in the above regards. The structure, conditions, procedures, and advantageous effects, not described above, of the third embodiment are similar to those of the first and second embodiment.

Even though, in the above embodiments, the semiconductor substrate SUB is of a p-type (having a p-type impurity region PR1), the semiconductor substrate SUB may also be of an n-type (having an n-type impurity region).

The above embodiments of the invention should be considered in all respects as illustrative and not restrictive. It is intended that the scope of the invention be indicated by the appended claims, rather than the foregoing description, and all changes which come within the meaning and range of equivalency of the claims are to be embraced therein.

The present invention can be particularly advantageously applied to a semiconductor device provided with a logic circuit having a MIS structure.

What is claimed is:

1. A semiconductor device, comprising:
    a semiconductor substrate having a main surface;
    source and drain regions formed in the main surface of the semiconductor substrate;
    a gate insulating film formed, over a region between the source and drain regions, to be in contact with the main surface; and
    a gate electrode formed to be in contact with an upper surface of the gate insulating film and having a length of less than 45 nm and greater than zero in a direction from the source region to the drain region so as to make a transistor function,
    wherein the source and drain regions, the gate insulating film, and the gate electrode configure the transistor, and
    wherein the gate insulating film has an antiferroelectric film including at least one selected from a group of $Pb(In_{0.5}Nb_{0.5})O_3$, $NH_4H_2PO_4$, and $NH_4H_2AsO_4$.

2. The semiconductor device according to claim 1, wherein the gate insulating film has a thickness of 2 nm or more but less than 50 nm.

3. The semiconductor device according to claim 1, wherein an aspect ratio of a thickness of a gate portion including the gate insulating film and the gate electrode to the length of the gate electrode is 2 or larger but smaller than 4.

4. The semiconductor device according to claim 1, further comprising:
    an impurity region for capacitance formed in the main surface of the semiconductor substrate;
    a dielectric film for capacitance formed over the impurity region for capacitance; and
    an electrode for capacitance formed over the dielectric film for capacitance to form a capacitance between the electrode for capacitance and the impurity region for capacitance,
    wherein the dielectric film has an antiferroelectric film, and
    wherein the impurity region for capacitance is different from the source and drain regions.

5. The semiconductor device according to claim 4, wherein the dielectric film for capacitance includes at least one selected from a group of $Pb(In_{0.5}Nb_{0.5})O_3$, $NbNaO_3$, $ZrPbO_3$, $TiZrLaPbO_3$, $TiZrPbO_3$, $NH_4H_2PO_4$, and $NH_4H_2AsO_4$.

6. The semiconductor device according to claim 1, further comprising:
    an impurity region for variable capacitance formed in the main surface of the semiconductor substrate;
    a dielectric film for variable capacitance formed over the impurity region for variable capacitance; and
    an electrode for variable capacitance formed over the dielectric film for variable capacitance to form a variable capacitance between the electrode for variable capacitance and the impurity region for variable capacitance,
    wherein the dielectric film for variable capacitance has an antiferroelectric film, and
    wherein the impurity region for variable capacitance is different from the source and drain regions.

7. The semiconductor device according to claim 6, wherein the dielectric film for variable capacitance includes at least one selected from a group of $Pb(In_{0.5}Nb_{0.5})O_3$, $NbNaO_3$, $ZrPbO_3$, $TiZrLaPbO_3$, $TiZrPbO_3$, $NH_4H_2PO_4$, and $NH_4H_2AsO_4$.

8. The semiconductor device according claim 1, further comprising a Schmitt trigger circuit including the transistor having the source and drain regions, the gate insulating film, and the gate electrode.

9. The semiconductor device according to claim 1, further comprising:
    a substrate contact formed in the main surface of the semiconductor substrate; and a substrate contact electrode provided over the main surface of the semiconductor substrate and connected to the semiconductor substrate as an electrode of the transistor having the gate electrode, the source and drain regions, and the substrate contact.

10. A semiconductor device, comprising:
a semiconductor substrate having a main surface; and
a transistor including:
  source and drain regions each formed in the main surface of the semiconductor substrate,
  a gate insulating film formed over a portion between the source and drain regions in the main surface of the semiconductor substrate, and
  a gate electrode formed over an upper surface of the gate insulating film and having a length of less than 45 nm and greater than zero in a direction from the source region to the drain region so as to make the transistor function,
  wherein the gate insulating film has an antiferroelectric film for suppressing a gate leak current between the gate electrode and the semiconductor substrate through the gate insulating film, and
  wherein the gate insulating film includes at least one selected from a group of $Pb(In_{0.5}Nb_{0.5})O_3$, $NH_4H_2PO_4$ and $NH_4H_2AsO_4$.

11. The semiconductor device according to claim 10, wherein the gate electrode has a length of less than 28 nm in the direction from the source region to the drain region.

12. The semiconductor device according to claim 10, wherein the gate electrode has polycrystalline silicon directly contacting the gate insulating film.

13. The semiconductor device according to claim 10, wherein the gate insulating film has a thickness of 2 nm or more but less than 50 nm.

14. The semiconductor device according to claim 10, wherein an aspect ratio of a thickness of a gate portion including the gate insulating film and the gate electrode to the length of the gate electrode is 2 or larger but smaller than 4.

15. The semiconductor device according to claim 10, further comprising:
  an impurity region for capacitance formed on the semiconductor substrate, the impurity region for capacitance being a different region from the source and drain regions;
  a dielectric film for capacitance formed over the impurity region for capacitance and having an antiferroelectric film; and
  an electrode for capacitance formed over the dielectric film for capacitance to form a capacitance between the electrode for capacitance and the impurity region for capacitance, the electrode for capacitance having a same material as the gate electrode of the transistor.

16. The semiconductor device according to claim 10, further comprising:
  an impurity region for variable capacitance formed over the main surface ofon the semiconductor substrate, the impurity region for variable capacitance being a different region from the source and drain regions;
  a dielectric film for variable capacitance formed over the impurity region for variable capacitance and having an antiferroelectric film; and
  an electrode for variable capacitance formed over the dielectric film for variable capacitance to form a variable capacitance between the electrode for variable capacitance and the impurity region for variable capacitance, the electrode for variable capacitance having a same material as the gate electrode of the transistor.

17. The semiconductor device according claim 10, further comprising a Schmitt trigger circuit including the transistor having the source and drain regions, the gate insulating film, and the gate electrode.

* * * * *